United States Patent [19]

Ikemasu et al.

[11] Patent Number: 5,525,534
[45] Date of Patent: Jun. 11, 1996

[54] METHOD OF PRODUCING A SEMICONDUCTOR DEVICE USING A RETICLE HAVING A POLYGONAL SHAPED HOLE

[75] Inventors: Shinichiro Ikemasu; Taiji Ema; Masaya Katayama, all of Kawasaki, Japan

[73] Assignee: Fujitsu Limited, Kawasaki, Japan

[21] Appl. No.: 369,159

[22] Filed: Jan. 5, 1995

Related U.S. Application Data

[63] Continuation-in-part of Ser. No. 31,183, Mar. 12, 1993, abandoned.

[30] Foreign Application Priority Data

| Mar. 13, 1992 | [JP] | Japan | 4-055602 |
| Oct. 9, 1992 | [JP] | Japan | 4-271283 |

[51] Int. Cl.⁶ .......................... H01L 21/70; H01L 27/00
[52] U.S. Cl. .......................... 437/60; 437/228; 437/919; 437/948; 148/DIG. 106
[58] Field of Search .......................... 437/228, 52, 48, 437/60, 919, 948; 148/DIG. 103, DIG. 105, DIG. 104, DIG. 106, DIG. 20; 430/5, 311–318, 320, 323

[56] References Cited

U.S. PATENT DOCUMENTS

| 4,801,560 | 1/1989 | Wood et al. | 437/195 |
| 4,839,311 | 6/1989 | Riley et al. | 437/228 |
| 5,135,883 | 8/1992 | Bae et al. | 437/52 |
| 5,196,365 | 3/1993 | Gotou | 437/52 |
| 5,223,729 | 6/1993 | Kudoh et al. | 257/296 |
| 5,250,457 | 10/1993 | Dennison | 437/48 |
| 5,275,896 | 1/1994 | Gravofalo et al. | 430/5 |
| 5,292,677 | 3/1994 | Dennison | 437/52 |
| 5,328,807 | 7/1994 | Tanaka et al. | 430/311 |

FOREIGN PATENT DOCUMENTS 1-147857  6/1989  Japan.

OTHER PUBLICATIONS

"3–Dimensional Stacked Capacitor Cell for 16M and 64M DRAMS", Ema et al, IEDM Technical Digest, 1988, pp. 592–595.

"A Split Wordline Cell for 16Mb SRAM Using Polysilicon Sidewall Contacts", Itabashi et al, IEDM Technical Digest, 1991, pp. 477–480.

Primary Examiner—George Fourson
Assistant Examiner—H. Jey Tsai
Attorney, Agent, or Firm—Nikaido, Marmelstein, Murray & Oram

[57] ABSTRACT

A method of producing a semiconductor device includes the steps of (a) preparing a substrate having a semiconductor element formed in a predetermined region of a surface of the substrate, (b) forming a first layer on the substrate, where the first layer is made of silicon oxide including at least one of boron and phosphor, (c) forming a second layer on a surface of the first layer, where the second layer is made of a material selected from a group consisting of silicon nitride and silicon oxide nitride, (d) coating a resist layer on the entire surface of the substrate, (e) exposing and developing a predetermined region of the resist layer using a reticle having a first opening so as to form a second opening in the resist layer, where the first opening has a polygonal shape having n corners respectively having obtuse angles and n is a natural number satisfying $n \geq 5$, and (f) etching the second and first layers via the second opening.

11 Claims, 27 Drawing Sheets

(A)

(B)

FIG.26A  FIG.26B
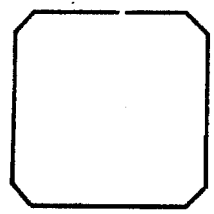 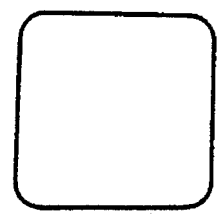
FIG.27
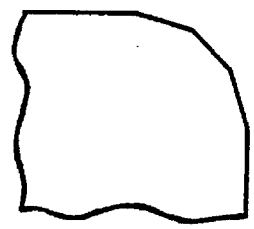

METHOD OF PRODUCING A SEMICONDUCTOR DEVICE USING A RETICLE HAVING A POLYGONAL SHAPED HOLE

This application is a Continuation-In-Part application of a U.S. patent application Ser. No. 031,183 entitled "SEMICONDUCTOR DEVICE AND METHOD OF PRODUCING THE SAME" filed Mar. 12, 1993, now abandoned.

BACKGROUND OF THE INVENTION

The present invention generally relates to semiconductor devices and method of producing the same, and more particularly to a semiconductor device having a stacked structure made up of conductor and insulator layers such as a stacked type capacitor, and to a method of producing such a semiconductor device.

Recently, in DRAMs which have become important in information processing systems such as computers, the formation of a capacitor having a large storage capacitance has become an important problem to be solved. However, as the size of the DRAM decreases with higher integration density, the area of one cell inevitably decreases. For this reason, three dimensional cells such as the stacked type capacitor and the trench type capacitor have been proposed for the purpose of securing a sufficient storage capacitance within a limited area. A fin type capacitor which is a kind of stacked type capacitor seems promising in that a storage capacitor of a large capacity DRAM having a memory capacity of 16M or greater can be realized. For example, the fin type capacitor is proposed in IEDM Technical Digest, 1988, p.592.

FIG. 1 (A) through (C) are diagrams explaining the construction of a conventional fin type capacitor.

In FIG. 1, there are shown a semiconductor substrate 21, a LOCOS oxide layer 22, a gate oxide layer 23, a gate electrode (word line) 24, a source region 25, a drain region 26, a word line 27 of another cell, an interlayer insulator 28, fin type storage electrodes 29-1, 29-2 and 29-3, a dielectric layer 30, and an opposing electrode 31.

FIG. 1 (A) shows the construction of one cell of a DRAM having a fin type capacitor which has one fin type storage electrode.

In this DRAM, the LOGOS oxide layer 22 which sections an element forming region is formed on the semiconductor substrate 21, and the gate oxide layer 23 is formed on this element forming region, as shown in FIG. 1 (A). The gate electrode 24 which becomes the word line is formed on the gate oxide layer 23, and the word line 27 of the other cell is formed on the LOGOS oxide layer 22. The source region 25 and the drain region 26 are formed in self-alignment to the gate electrode 24, and the interlayer insulator 28 is formed thereon. One fin type storage electrode 29-1 is formed at an opening which is formed above the drain region 26. The dielectric layer 30 is formed on the surface of the fin type storage electrode 29-1, and the opposing electrode 31 is formed in contact with the dielectric layer 30.

When the fin type capacitor having this fin type storage electrode is used, it is possible to form a capacitance at the top and bottom surfaces of the fin type storage electrode, thereby making it possible to obtain a large storage capacitance with the limited area occupied by the cell.

FIG. 1 (B) shows the construction of a fin type capacitor having two fin type storage electrodes, and FIG. 1 (C) shows the construction of a fin type capacitor having three fin type storage electrodes. As shown in these figures, it is possible to increase the number of fin type storage electrodes to two (29-1, 29-2), three (29-1, 29-2, 29-3), . . . Hence, it is possible to obtain a sufficient storage capacitance even if the cell area becomes small due to the high integration density.

In FIG. 1 (A), (B) and (C), the illustration of the bit line is omitted.

FIG. 2 shows a plan view of a DRAM having the conventional fin type capacitor.

In FIG. 2, there are shown word lines 44 and 47, a first opening 49, a bit line 50, a second opening 55, and a second polysilicon layer 56.

The cell structure of this DRAM will be described in conjunction with the production method with reference to FIGS. 3 and 4, but the bit line 50 extends in a horizontal direction and the word lines 44 and 47 extend in a vertical direction. A rectangular region indicated by a dotted line shows one cell of the DRAM. Lines X–X', Y–Y' and Z–Z' in FIG. 2 shows parts where the cross sections are taken in the cross sectional views which will be described later.

FIG. 3 (A) through (E) and FIG. 4 (A) through (C) are diagrams for explaining the processes of producing the DRAM having the conventional fin type capacitor.

In these figures, there are shown a semiconductor substrate 41, a LOCOS oxide layer 42, a gate oxide layer 43, a gate electrode 44, a source region 45, a drain region 46, a word line 47 of another cell, an interlayer insulator 48, a first opening 49, a bit line 50, a $Si_3N_4$ layer 51, a first $SiO_2$ layer 52, a first polysilicon layer 53, a second $SiO_2$ layer 54, a second opening 55, a second polysilicon layer 56, a dielectric layer 57, and an opposing electrode 58.

A description will be given of the conventional method of producing the fin type capacitor having two fins, with reference to these explanatory diagrams. These explanatory diagrams show the cross section along the line X–X' in FIG. 2 which shows the plan view of a part of the DRAM.

First Process (Refer to FIG. 3 (A)):

The surface of the p-type semiconductor substrate 41 is thermally oxidized to form the LOCOS oxide layer 42 which sections the element region. The gate oxide layer 43 is formed on this element region by a thermal oxidation, and a polysilicon layer is formed thereon by a CVD. The polysilicon layer is patterned to form the gate electrode 44 which also becomes the word line, and the source region 45 and the drain region 46 are formed in self-alignment to the gate electrode 44. In addition, the word line 47 of the other cell is formed on the LOCOS oxide layer 42 at the same time as the gate electrode 44.

Second Process (Refer to FIG. 3 (B)):

The interlayer insulator 48 which is made up of $SiO_2$ is deposited by CVD to cover the entire surface, and the first opening 49 is provided at the contact part of the bit line.

Third Process (Refer to FIG. 3 (C)):

A stacked layer of polysilicon layer and tungsten silicide (WSi) is deposited by CVD on the entire surface including the first opening 49. This stacked layer is patterned to form the bit line 50 which is connected to the source region 45 within the first opening 49.

Fourth Process (Refer to FIG. 3 (D)):

The $Si_3N_4$ layer 51, the first $SiO_2$ layer 52, the first polysilicon layer 53, and the second $SiO_2$ layer 54 are successively deposited thereon by CVD.

Fifth Process (Refer to FIG. 3 (E)):

The second $SiO_2$ layer 54, the first polysilicon layer 53, the first $SiO_2$ layer 52, the $Si_3N_4$ layer 51, the interlayer insulator 48, and the gate oxide layer 43 on the drain region 46 are etched using the same resist mask, so as to form the second opening 55 at the storage electrode contact part.

Sixth Process (Refer to FIG. 4 (A)):

The second polysilicon layer 56 is formed by CVD on the entire surface including the second opening 55. Then, the second polysilicon layer 56, the second $SiO_2$ layer 54 and the first polysilicon layer 53 are successively etched to pattern the same to a predetermined shape.

Seventh Process (Refer to FIG. 4 (B)):

The second $SiO_2$ layer 54 and the first $SiO_2$ layer 52 are etched by an isotropic wet etching using a HF solution, so as to form fin type storage electrodes made up of the first and second polysilicon layers 53 and 56. The $Si_3N_4$ layer 51 acts as a stopper with respect to the etching using HF (hydrofluoric acid).

Eighth Process (Refer to FIG. 4 (C)):

The dielectric layer 57 is formed on the surfaces of the fin type storage electrodes which are made up of the first and second polysilicon layers 53 and 56, and a polysilicon layer is deposited by CVD to form the opposing electrode 58 and complete the fin type capacitor cell.

Thereafter, a BPSG layer is formed by a normal process, and the necessary aluminum wiring is made thereon.

However, according to the conventional method described above, the following problems are generated.

1. A short-circuit may occur between the conductor layers.

FIG. 5 is a diagram for explaining the process of patterning the storage electrode by the conventional method. FIG. 5 shows the cross section along the line Z–Z' in FIG. 2. In FIG. 5, there are shown the semiconductor substrate 41, the LOCOS oxide layer 42, the interlayer insulator 48, the bit line 50, the $Si_3N_4$ layer 51, the first $SiO_2$ layer 52, the first polysilicon layer 53, the second $SiO_2$ layer 54, and the second polysilicon layer 56.

FIG. 5 (A) shows a stage where the LOCOS oxide layer 42 is formed on the semiconductor layer 41, the interlayer insulator 48 is formed, the bit line 50 is formed, and the $Si_3N_4$ layer 51, the first $SiO_2$ layer 52, the first polysilicon layer 53, the second $SiO_2$ layer 54 and the second polysilicon layer 56 are formed thereon.

FIG. 5 (B) shows a state where the uppermost second polysilicon layer 56 is removed. Since this figure is the cross section along the line Z–Z' in FIG. 2, the second polysilicon layer 56 is to be eliminated completely. However, since the second polysilicon layer 56 includes a stepped part, the second polysilicon layer 56 partially remains on the sidewall portion of the stepped part.

FIG. 5 (C) shows a state where the first polysilicon layer 53 is removed. In this case, since the first polysilicon layer 53 includes a stepped part, the first polysilicon layer 53 partially remains at the sidewall portion of the stepped part.

If the second polysilicon layer 56 or the first polysilicon layer 53 remains, there is a possibility of the adjacent storage electrodes becoming short-circuited by the etching residue of the polysilicon which is lifted off when the $SiO_2$ layers 52 and 54 and the like are removed at the subsequent processes.

In order to eliminate the above described etching residue, the etching time is normally made longer when etching the polysilicon by RIE, so as to make the so-called over-etching. However, if the over-etching is excessively made, too much of the flat portion becomes etched and the underlayer will be damaged. On the other hand, the etching is normally made using a resist mask which is patterned, and there is also a problem in that the resist will not be usable as a mask if the resist is damaged by the over-etching. Furthermore, the so-called etching shift in which the line width becomes narrow will occur when the over-etching is made, and there is still another problem in that the obtained pattern becomes smaller than the desired pattern.

On the other hand, the etching time naturally increases when the over-etching is made, and the production cost of the semiconductor device is increase thereby. In addition, when forming the fin type capacitor having a plurality of fins, it is necessary to alternately make the selective etching of the conductor layer and the insulator layer, and the total etching time is considerably increased when the over-etching is made because the number of etching processes is quite large to start with.

2. The thickness of the photoresist layer will become non-uniform.

FIG. 6 (A) and (B) is a diagram for explaining the conventional photolithography process for forming a contact hole. In this figure, there are shown the semiconductor substrate 41, the LOCOS oxide layer 42, the gate oxide layer 43, the gate electrode 44, the source region 45, the drain region 46, the word line 47 of the other cell, the interlayer insulator 48, the first opening 49, the $Si_3N_4$ layer 51, the first $SiO_2$ layer 52, the first polysilicon layer 53, the second $SiO_2$ layer 54, a photoresist layer 59, and a photomask 60.

FIG. 6 (A) shows the cross section along the line X–X' in FIG. 2. The LOCOS oxide layer 42 is formed on the semiconductor substrate 41, the gate oxide layer 43 is formed, and the gate electrode 44 and the word line 47 of the other cell are formed. Then, the interlayer insulator 48 is formed, and the bit line 50 is formed. The $Si_3N_4$ layer 51, the first $SiO_2$ layer 52, the first polysilicon layer 53, the second $SiO_2$ layer 54, and the second polysilicon layer 58 are formed thereon. The photoresist layer 59 is formed on top, and an exposure is made using the photomask 60.

FIG. 6 (B) shows the cross section along the line Y–Y' in FIG. 2. The LOCOS oxide layer 42 is formed on the semiconductor layer 41, the gate oxide layer 43 and the interlayer insulator 48 are formed, and the bit line 50 is formed. Then, the $Si_3N_4$ layer 51, the first $SiO_2$ layer 52, the first polysilicon layer 53, and the second $SiO_2$ layer 54 are formed thereon. The photoresist layer 59 is formed on top, and an exposure is made using the photomask 60.

Hence, according to the conventional process of producing the fin type storage electrode, the second $SiO_2$ layer 54, the first polysilicon layer 53, the first $SiO_2$ layer 52, the $Si_3N_4$ layer 51, the interlayer insulator 48 and the gate oxide layer 43 are etched by the photolithography technique to form the opening which is used to form the fin type storage electrode. But since a stepped part exists on the surface of the uppermost second $SiO_2$ layer 54 when forming this opening, the thickness of the photoresist layer 59 which is spin-coated on the uppermost second $SiO_2$ layer 54 becomes extremely non-uniform. As a result, it is difficult to accurately form a fine contact opening, and there is a problem in that the production yield is deteriorated thereby.

3. A disconnection easily occurs at the contact hole.

In FIG. 4 (B), when forming the fin type storage electrodes made up of the first and second polysilicon layers 53 and 56, the isotropic etching using the HF solution is made to remove the $SiO_2$ layers 54 and 52. When making this isotropic etching, the $Si_3N_4$ layer 51 which isolates the bit line 50 acts as a stopper (mask) with respect to the HF solution, and the etching of the bit line 50 will not occur even if submerged in the HF solution. However, the existence of the Si$_3$N$_4$ layer 51 introduces a problem shown in FIG. 7.

FIG. 7 shows a cross section of a peripheral circuit part of the conventional memory described in conjunction with FIGS. 3 and 4. In FIG. 7, those parts which are the same as those corresponding parts in FIGS. 3 and 4 are designated by the same reference numerals, and a description thereof will be omitted. In FIG. 7, there are shown an impurity diffusion layer 37, a BPSG layer 38, and an Al layer 39.

When a contact hole shown in FIG. 7 (A) is formed and the Al layer 39 is formed thereafter, it is necessary to stabilize the contact resistance between the impurity diffusion layer 37 and the Al layer 39. Normally, a pre-process is made using a solution of the HF system before forming the Al layer 39, so as to remove the natural oxide layer on the impurity diffusion layer 37.

However, if such a pre-process is made, the BPSG layer 38 and the SiO$_2$ layer 48 will recede by being etched by the HF solution, but the Si$_3$N$_4$ will not be etched. As a result, only the Si$_3$N$_4$ layer 51 projects within the contact hole as shown in FIG. 7 (B).

When the Al layer 39 is formed by sputtering over a contact hole having such a shape, there is a problem in that a disconnection of the Al layer 39 easily occurs at a part A as shown in FIG. 7 (C).

SUMMARY OF THE INVENTION

Accordingly, it is a general object of the present invention to provide a novel and useful semiconductor device and method of producing the same, in which the problems described above are eliminated.

Another and more specific object of the present invention is to provide a semiconductor device comprising a substrate having a top surface, and a fin type capacitor having a first electrode including a first part which extends upwards from the substrate and a second part which extends approximately parallel to the top surface of the substrate from the first part, where the second part is made up of at least one conductor layer.

Still another object of the present invention is to provide a method of producing a semiconductor device comprising the steps of forming above a substrate surface a first insulator layer which has a surface approximately parallel to the substrate surface, alternately forming a first conductor layer and a second insulator layer at least once, forming a contact hole which reaches the substrate by penetrating each second insulator layer, each first conductor layer and the first insulator, forming a second conductor layer on an uppermost second insulator layer and on a surface of the contact hole, and patterning the second and first conductor layers to a predetermined shape. According to the present invention, there is no possibility of a conductor layer remaining at the stepped part when patterning the conductor layer and short-circuiting the adjacent storage electrodes. In addition, since the underlayer of the photoresist layer is flat, the photoresist layer can be coated uniformly, thereby stabilizing the photolithography process and realizing a high production yield. Further, by forming the uppermost fin of the storage electrode so as not to have undulations, the process of forming the contact hole is facilitated. In addition, it becomes possible to completely etch the conductor layer at the time of the patterning, thereby preventing the short-circuit of the adjacent storage electrodes. In addition, by employing a structure which includes no nitride layer at the contact hole part, it is possible to prevent a disconnection of the second conductor layer within the contact hole. Accordingly, it is possible to stably produce a fine fin type capacitor cell with improved reliability and yield.

A further object of the present invention is to provide a method of producing a semiconductor device comprising the steps of (a) forming a first insulator layer above a substrate surface, (b) alternately forming a first conductor layer and a second insulator layer at least once, (c) forming a contact hole which reaches the substrate by penetrating each second insulator layer and each first conductor layer, (d) forming a second conductor layer on an uppermost second insulator layer and on a surface of the contact hole, and (e) patterning the second and first conductor layers, where at least one of the steps (c) and (e) continuously etches at least the second insulator layer and the first insulator layer under a condition such that each layer is etched at approximately the same etching speed. According to the present invention, it is possible to greatly reduce the number of production processes.

Another object of the present invention is to provide a method of producing a semiconductor device comprising the steps of (a) preparing a substrate having a semiconductor element formed in a predetermined region of a surface of the substrate, (b) forming a first layer on the substrate, the first layer being made of silicon oxide including at least one of boron and phosphor, (c) forming a second layer on a surface of the first layer, the second layer being made of a material selected from a group consisting of silicon nitride and silicon oxide nitride, (d) coating a resist layer on the entire surface of the substrate, (e) exposing and developing a predetermined region of the resist layer using a reticle having a first opening so as to form a second opening in the resist layer, the first opening having a polygonal shape having n corners respectively having obtuse angles, where n is a natural number satisfying n≧5, and (f) etching the second and first layers via the second opening. According to the method of the present invention, it is possible to prevent the generation of cracks in the silicon nitride layer or the silicon oxide nitride layer that is formed on the surface of the BPSG layer or the like. As a result, it is possible to improve both the reliability and production yield of the semiconductor device.

It is possible to smoothen the corner portions of the opening of the through hole that is formed in the SiN layer and the silicon oxide layer (BPSG layer) including at least one of boron and phosphor, by making the corresponding reticle pattern have a polygonal shape having n obtuse angled corner portions, where n≧5. As a result, it is possible to prevent the stress that is generated in the SiN layer from being concentrated at the corner portions. Since the concentration of the stress at the corner portions can be prevented, it is possible to suppress the generation of the cracks.

The opening of the target mark for alignment formed in the dicing region of the wafer or the opening of the test pattern formed within the chip normally has a size of approximately several tens of μm. The corner portions of the opening of such a through hole that is relatively large are clearly formed by photolithography. Accordingly, smoothing the corner portions of the opening of the target mark or test pattern is particularly effective for the purpose of preventing the generation of the cracks.

Of course, the generation of the cracks can be effectively prevented by smoothing the corner portions of the through holes which are other than the target mark and the test pattern, exist within the chip or the dicing region, and has a size of several μm or greater.

When the thickness of the silicon nitride layer or the silicon oxide nitride layer (SiN layer) formed on the surface of the BPSG layer is 30 nm or less, it is possible to prevent the generation of the cracks in the SiN layer that would occur at the interface of the two layers due to stress. In addition, by setting the thickness of the SiN layer greater than the thickness of a certain layer that is formed on the SiN layer and is etched by the etchant within an etching time of this certain layer, it becomes possible to use the SiN layer as an etching stopper.

It is possible to form a fin type electrode by forming a conductor layer on the SiN layer and another layer having an etching resistance different from that of the conductor layer so as to form a stacked structure, and removing the other layer after patterning the stacked structure.

In a case where the shape of the fin type electrode in the plan view has a parallelogram shape having a contact hole opening at the center of the parallelogram shape, the etching time of the other layer is set to a time required to etch a thickness corresponding to the length of a perpendicular drawn from the center to the longer side of the parallelogram shape.

When a dielectric layer is formed on the surface of the fin type electrode and an opposing electrode is provided, it is possible to realize a capacitor having a large storage capacity.

It is possible to form a memory cell of a DRAM by connecting the fin type electrode to one of the source and drain regions of the MOSFET.

Still another object of the present invention is to provide a semiconductor device comprising a substrate having a surface and a semiconductor element formed in a predetermined region of the surface, a first layer, formed on the surface of the substrate, having a surface and made of silicon oxide including a material selected from a group consisting of boron and phosphor, a second layer, formed on the surface of the first layer, made of a material selected from a group consisting of silicon nitride and silicon oxide nitride, a first hole penetrating the first and second layers and reaching the surface of the substrate, and a second hole penetrating the first and second layers, where the second hole is larger than the first hole and has inner peripheral edges with smoothened corner portions. According to the semiconductor device of the present invention, it is possible to prevent the generation of cracks in the silicon nitride layer or the silicon oxide nitride layer that is formed on the surface of the BPSG layer or the like. As a result, it is possible to improve both the reliability and production yield of the semiconductor device.

A further object of the present invention is to provide a reticle comprising a substrate, a rectangular pattern formed in the substrate and having a side with a first length, a polygonal pattern formed in the substrate and containing an imaginary circle having a diameter with a second length that is greater than the first length, where the polygonal pattern has n corners respectively having obtuse angles, and n is a natural number satisfying n≧5. According to the reticle of the present invention, it is possible to prevent the generation of cracks in the silicon nitride layer or the silicon oxide nitride layer that is formed on the surface of the BPSG layer or the like. As a result, it is possible to improve both the reliability and production yield of the semiconductor device.

Another object of the present invention is to provide a method of producing a semiconductor device comprising the steps of (a) preparing a substrate having a semiconductor element formed in a predetermined region of a surface of the substrate, (b) forming a first layer on a surface of the substrate, the first layer being made of silicon oxide including at least one of boron and phosphor, (c) forming a second layer on a surface of the first layer, the second layer being made of a material selected from a group consisting of silicon nitride and silicon oxide nitride, (d) forming a third layer on a surface of the second layer, the third layer having an etching resistance different from that of the second layer, and (e) etching the third layer for a predetermined time using a predetermined etchant, where the second layer has a thickness less than 30 nm and greater than a thickness of the second layer etched by the predetermined etchant in the predetermined time.

Still another object of the present invention is to provide a semiconductor device comprising a substrate having a surface and a semiconductor element formed in a predetermined region of the surface, a first layer, formed on the surface of the substrate, having a surface and made of silicon oxide including a material selected from a group consisting of boron and phosphor, a second layer, formed on the surface of the first layer, made of a material selected from a group consisting of silicon nitride and silicon oxide nitride, a contact hole penetrating the first and second layers and reaching the surface of the substrate, and a fin type storage electrode having a first portion formed on an inner surface of the contact hole and a second portion connected to the first portion and extending approximately parallel to the second layer.

Other objects and further features of the present invention will be apparent from the following detailed description when read in conjunction with the accompanying drawings.

BRIEF DESCRIPTION OF THE DRAWINGS

FIGS. 26A and 26B respectively are plan views showing a reticle pattern and a pattern exposed on the wafer when producing a DRAM by an eleventh embodiment of the method of producing the semiconductor device according to the present invention;

FIG. 27 is a plan view, on an enlarged scale, showing a corner portion of another reticle pattern used in the eleventh embodiment of the method;

DESCRIPTION OF THE PREFERRED EMBODIMENTS

First, a description will be given of the operating principle of a first embodiment of a method of producing a semiconductor device according to the present invention, by referring to FIG. 8.

This embodiment includes a step of forming a first insulator layer on a substrate, a step of forming a contact opening which penetrates the first insulator layer and reaches the substrate, a step of forming a first conductor layer on the first insulator layer and including the opening, a step of patterning the first conductor layer to a predetermined shape, and a step of removing at least a part of the first insulator layer under the first conductor layer, and forms the first insulator layer by coating SOG. It is possible to form a semiconductor device having storage electrodes with two or more fins, by alternately forming one or more conductor layers and one or more insulator layers after the step of forming the first insulator layer on the substrate.

Figure 8:
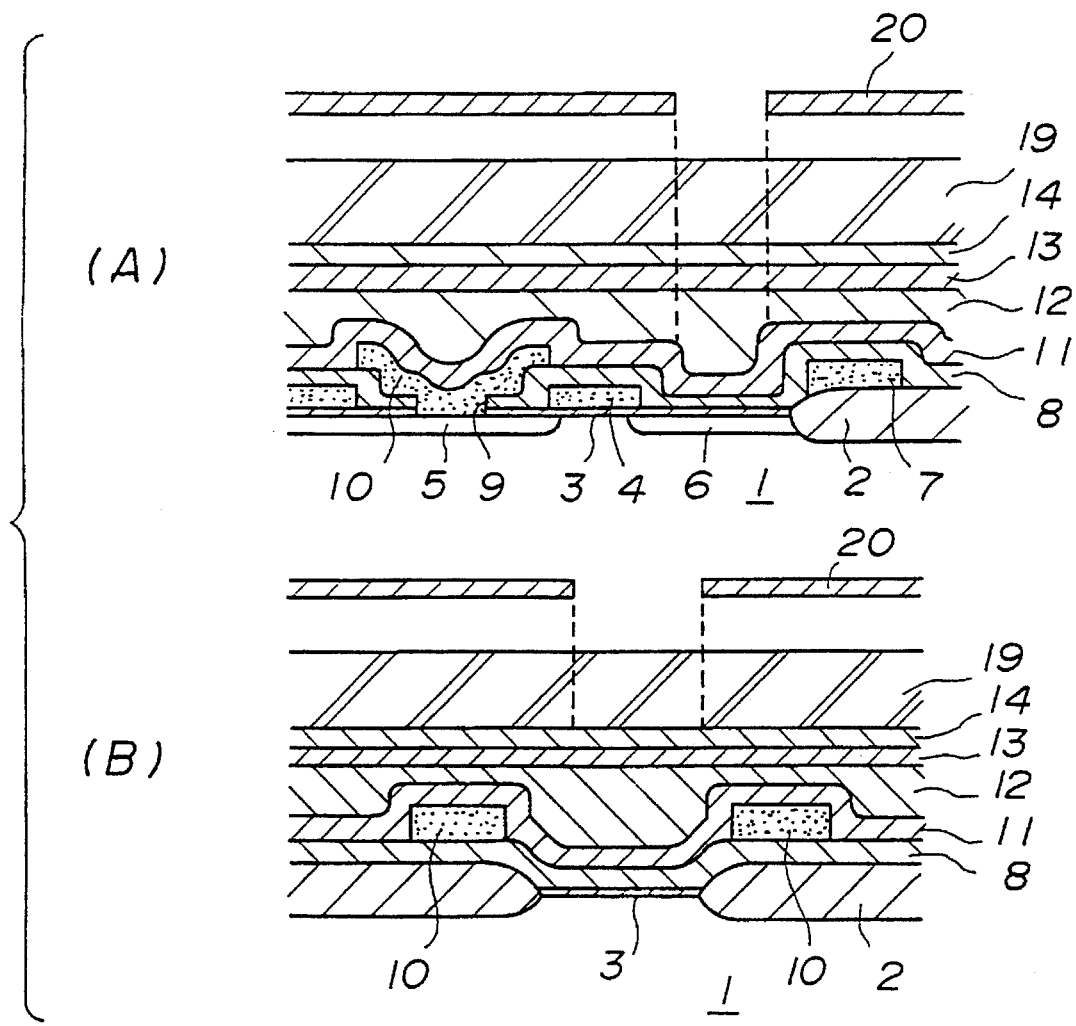
FIG. 8 in parts (A) and (B) is a cross sectional view for explaining the operating principle of a first embodiment of a method of producing a semiconductor device according to the present invention.

FIG. 8 (A) and (B) is a diagram for explaining the operating principle of this embodiment.

In FIG. 8, there are shown a semiconductor substrate 1, a LOCOS oxide layer 2, a gate oxide layer 3, a gate electrode 4, a source region 5, a drain region 6, a word line 7, an interlayer insulator 8, a first opening 9, a bit line 10, a $Si_3N_4$ layer 11, a SOG layer 12, a first polysilicon layer 13, a second $SiO_2$ layer 14, a resist layer 19, and a photomask 20.

Figure 1:
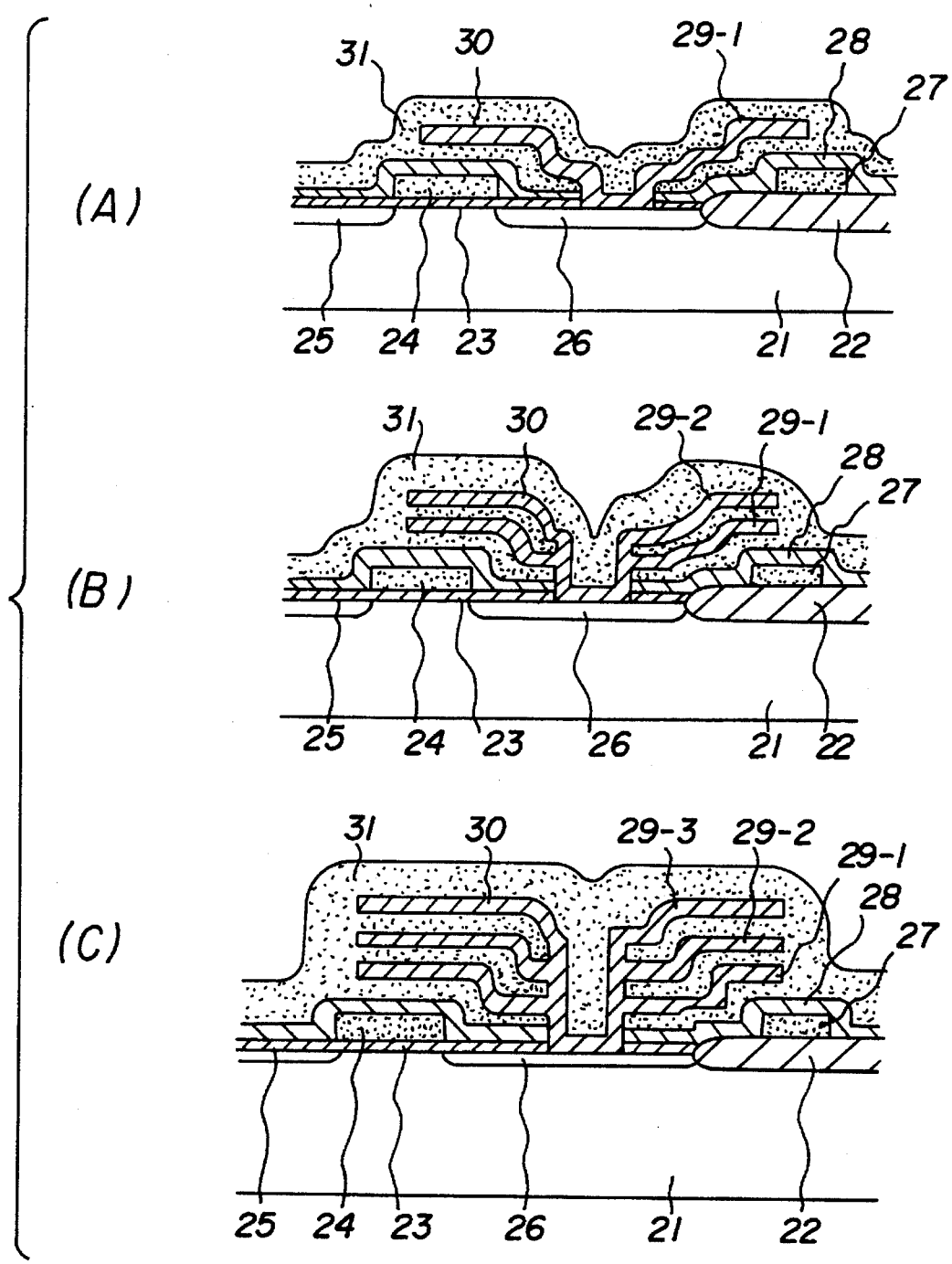
FIG. 1 in parts (A) through (C) is a cross sectional view for explaining the construction of a conventional fin type capacitor.
Figure 2:
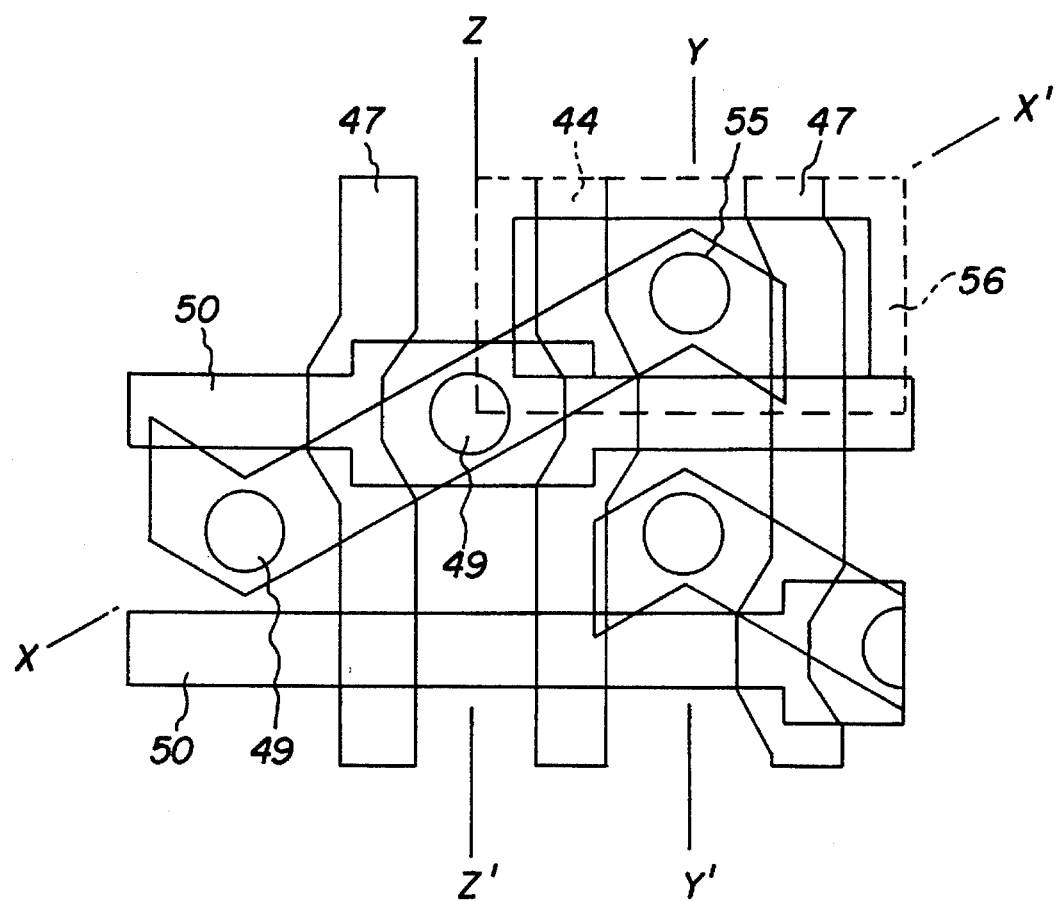
FIG. 2 is a plan view showing an essential part of a DRAM having the conventional fin type capacitor.

FIG. 8 (A) shows a cross section along the line X–X' in FIG. 2, and FIG. 8 (B) shows the cross section along the line Y–Y' in FIG. 2. Although FIG. 2 shows the plan view of the part of the conventional DRAM, the plan view of this embodiment is the same as that shown in FIG. 2.

In this embodiment, the LOCOS oxide layer 2 which sections an element forming region is formed on the surface of the p-type semiconductor substrate 1, and the gate oxide layer 3 is formed on this element forming region.

Then, the gate electrode 4 made of polysilicon and the word line 7 of the other cell are formed on top. The n-type source region 5 and the drain region 6 are formed in self-alignment to the gate electrode 4.

Next, the interlayer insulator 8 is formed on top, and the bit line 10 is formed on the source region 5 which is exposed within the first opening 9 which is provided at the contact part of the bit line.

The $Si_3N_4$ layer 11 is formed on top, and the SOG layer 12 is formed thereon by spin-coating. In addition, the first polysilicon layer 13 and the second $SiO_2$ layer 14 are successively deposited thereon.

The photoresist layer 19 is formed on top, and this photoresist layer 19 is exposed via a window in the photomask 20. Thereafter, the photoresist layer 19 is developed, and the exposed region of the photoresist layer 19 is removed.

According to these processes, the SOG layer 12 is formed on the surface of the $Si_3N_4$ layer 11 which has large undulations so as to planarize the top surface. As a result, the surfaces of the first polysilicon layer 13 and the second $SiO_2$ layer 14 which are thereafter successively deposited on the SOG layer 12 are also planarized.

For this reason, the photoresist layer 19 is uniformly coated, and the photolithography process is stabilized. In addition, when patterning the storage electrodes, there is no possibility of short-circuiting the adjacent storage electrodes by the etching residue of the first polysilicon layer 13 or the second polysilicon layer. Therefore, it is possible to realize a high production yield.

It is possible to form the second oxide layer 14 or an oxide layer which is formed above the second oxide layer 14 by the SOG. In such cases, effects similar to those described above may be obtained because the surface of the polysilicon layer which is formed after the SOG oxide layer is planarized.

SOG was conventionally used as a planarizing material in the production processes of semiconductor devices. However, the insulation resistance or the like of the SOG was insufficient, and a stable process could not be realized. In addition, there was a possibility of introducing a problem in the characteristic of the semiconductor devices after production thereof.

However, in this embodiment, although the SOG is used as the planarizing material, the SOG is removed by the HF at a subsequent stage when forming the fins. For this reason, such problems will not occur in this embodiment.

This embodiment has particularly notable effects when applied to the method of producing the fin type storage electrodes of the capacitor of the DRAM, however, it is of course possible to apply this embodiment to the production of other semiconductor devices.

Next, a more detailed description will be given of this embodiment, by referring to FIGS. 9 and 10.

Figure 9:
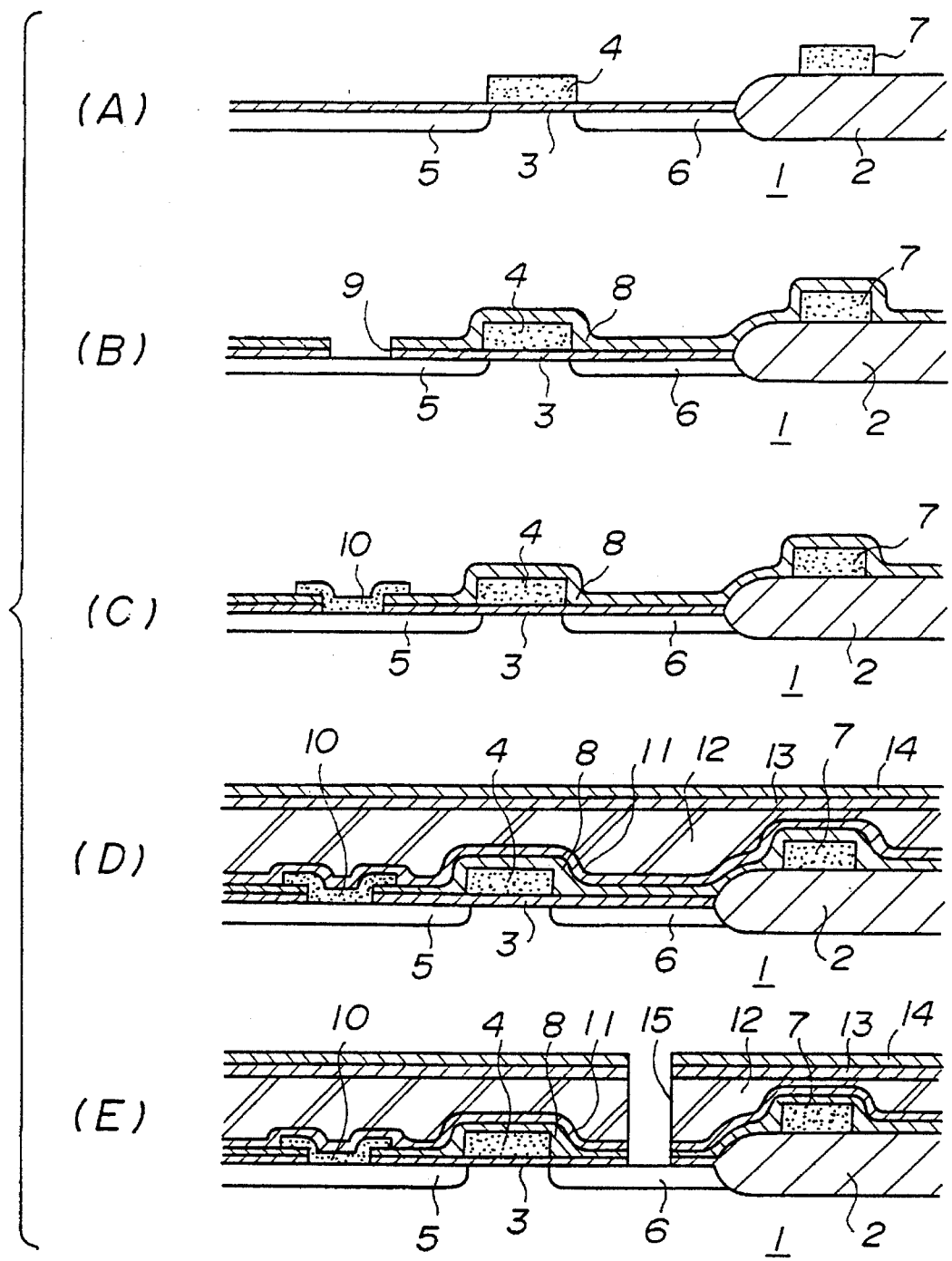
FIG. 9 in parts (A) through (E) and FIG. 10 in parts (A) through (C) are cross sectional views for explaining production processes of first and second embodiments of the method of producing the semiconductor device according to the present invention.
Figure 10:
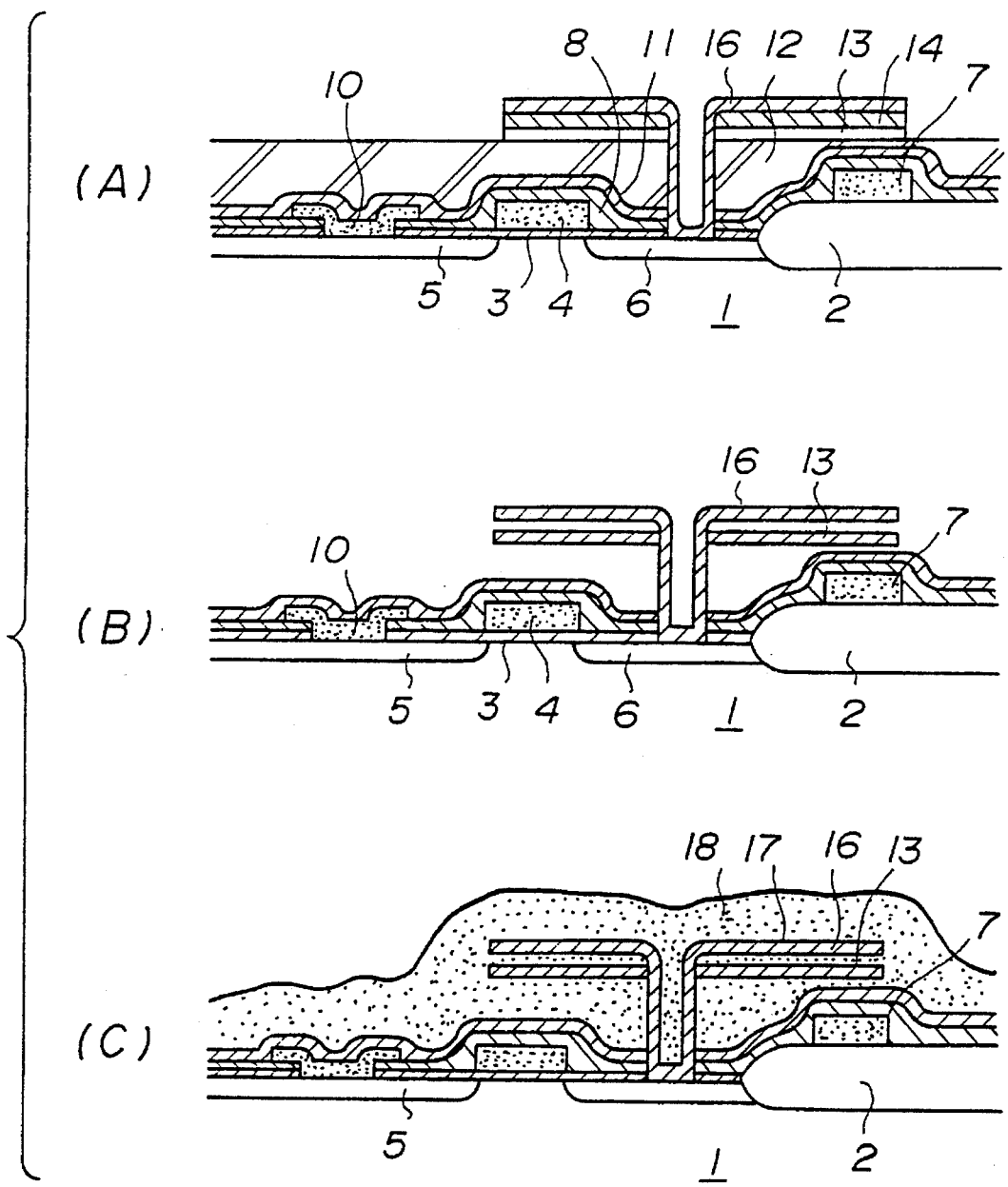

FIG. 9 (A) through (E) and FIG. 10 (A) through (C) are diagrams for explaining the production processes of the first embodiment, and in this embodiment, the present invention is applied to the method of producing the DRAM having the fin type capacitor.

In FIGS. 9 and 10, there are shown the semiconductor substrate 1, the LOCOS oxide layer 2, the gate oxide layer 3, the gate electrode 4, the source region 5, the drain region 6, the word line 7, the interlayer insulator 8, the first opening 9, the bit line 10, the $Si_3N_4$ layer 11, the SOG layer 12, the first polysilicon layer 13, the second $SiO_2$ layer 14, a second opening 15, a second polysilicon layer 16, a dielectric layer 17, an opposing electrode 18.

The first embodiment of the method of producing the DRAM having the fin type capacitor will be described by referring to these explanatory diagrams of the production processes.

These explanatory diagrams of the production processes show the cross section along the line X–X' in FIG. 2 which shows the plan view of the part of the DRAM. Although FIG. 2 shows the plan view of the part of the conventional DRAM, the plan view in this embodiment is the same as that shown in FIG. 2.

First Process (Refer to FIG. 9 (A)):

The surface of the semiconductor substrate 1 which is made of p-type silicon is thermally oxidized to form the LOCOS oxide layer 2 which has a thickness of 3000 Å and sections the element forming region. The gate oxide layer 3 having a thickness of 100 Å is formed on the element forming region by thermal oxidation, and a polysilicon layer having a thickness of 1500 Å is formed thereon by CVD. The polysilicon layer is patterned to form the gate electrode 4 which also becomes the word line. The n-type source region 5 and the drain region 6 are formed in self-alignment to the gate electrode 4. In addition, the word line 7 of the other cell is formed on the LOCOS oxide layer 3 at the same time as the gate electrode.

Second Process (Refer to FIG. 9 (B)):

The interlayer insulator 8 which is made of $SiO_2$ is deposited by CVD to a thickness of 1000 Å, and the first opening 9 is provided at the contact part of the bit line.

Third Process (Refer to FIG. 9 (C)):

A polysilicon layer having a thickness of 500 Å and a tungsten silicide (WSi) having a thickness of 1000 Å are deposited by CVD on the entire surface including the first opening 9. The WSi layer and the polysilicon layer are patterned to form the bit line 10 which connects to the source region 5 which is exposed within the first opening 9.

Figure 6:
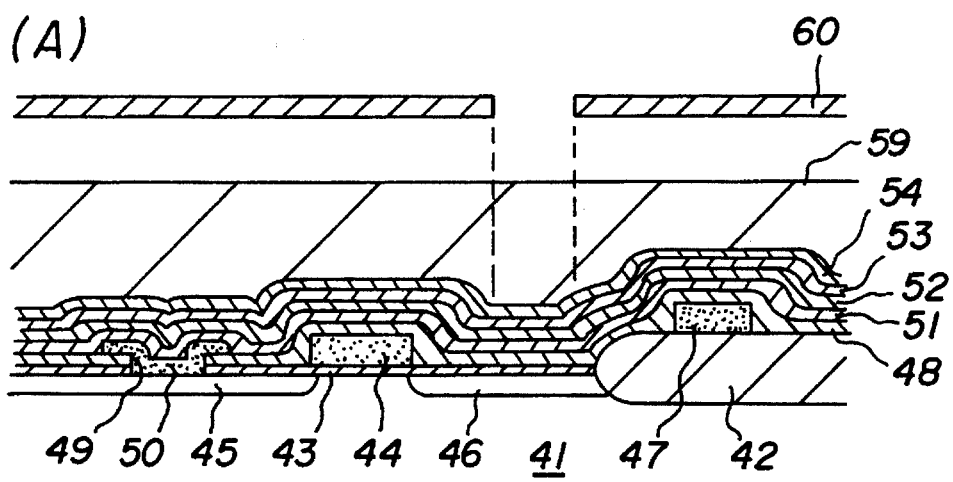
FIG. 6 in parts (A) and (B) is a cross sectional view for explaining a photolithography process of a contact hole according to a conventional method.
Figure 6:
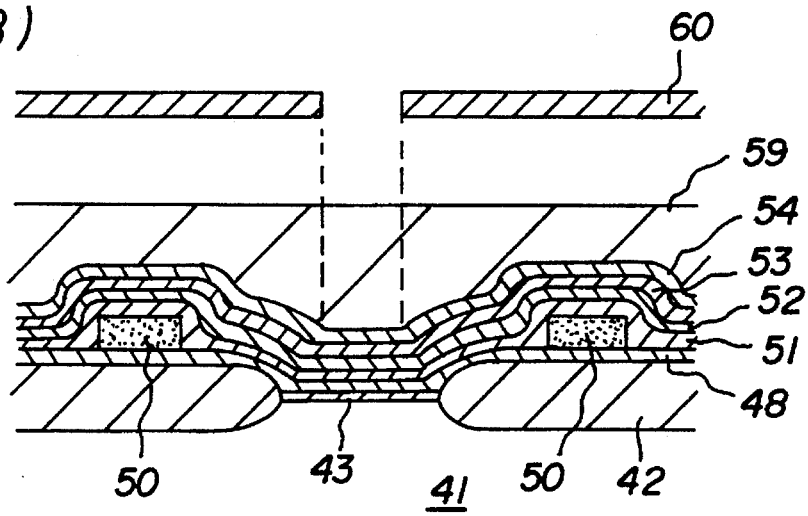

Fourth Process (Refer to FIG. 9 (D)):

Next, the $Si_3N_4$ layer 11 having a thickness of 500 Å is formed on top by CVD. Then, an insulator is spin-coated on the $Si_3N_4$ layer 11, so as to form the SOG (Spin-On-Glass) layer 12 which has a thickness of 500 Å at a part corresponding to the first $SiO_2$ layer (52 of FIG. 6 (D)) of the prior art, so as to planarize the surface.

The surface of the SOG layer 12 becomes approximately planar because the SOG layer 12 is spin-coated to a sufficient thickness such that the conductor layer underneath is completely covered thereby. By heating the SOG layer 12 and thermally solidifying the same in the generally known manner, the SOG insulator layer having the planar (flat) surface is formed. This SOG insulator layer 12 is etched back by a plasma etching, for example, until it becomes a predetermined thickness.

Further, the first polysilicon layer 13 having a thickness of 500 Å and the second $SiO_2$ layer 14 having a thickness of 500 Å are successively deposited on the SOG layer 12 by CVD.

Fifth Process (Refer to FIG. 9 (E)):

The second $SiO_2$ layer 14, the first polysilicon layer 13, the SOG layer 12, the $Si_3N_4$ layer 11, the interlayer insulator 8 and the gate oxide layer 3 on the drain region 6 are etched using the same resist mask, so as to form the second opening 15 for the contact part of the storage electrode.

Sixth Process (Refer to FIG. 10 (A)):

The second polysilicon layer 16 having a thickness of 500 Å is formed by CVD on the entire surface including the second opening 15, and the second polysilicon layer 16, the second $SiO_2$ layer 14 and the first polysilicon layer 13 are successively etched to pattern the same to a predetermined shape.

Seventh Process (Refer to FIG. 10 (B)):

The second $SiO_2$ layer 14 and the SOG layer 12 are etched by an isotropic wet etching using a solution which includes approximately 1% hydrofluoric acid (HF), so as to form the fin type storage electrodes which are made up of the first polysilicon layer 13 and the second polysilicon layer 16. The $Si_3N_4$ layer 11 in this case acts as a stopper with respect to the HF etching.

Eighth Process (Refer to FIG. 10 (C)):

The dielectric layer 17, which is made up of a stacked layer of a $Si_3N_4$ layer having a thickness of 50 Å and a silicon oxide layer having a thickness of 10 Å, is formed on the surfaces of the fin type storage electrodes which are made up of the first polysilicon layer 13 and the second polysilicon layer 18. The $Si_3N_4$ is formed by CVD, and the silicon oxide layer is formed by thermal oxidation. Thereafter, a conductive polysilicon having a thickness of 1000 Å is formed by CVD to form the opposing electrode 18, and the fin type capacitor cell is thus completed.

In this embodiment, the number of fins is two. However, depending on the required electrostatic capacitance, it is possible to form three fins. In this case, the storage electrodes are formed by forming the second polysilicon layer 16 on the second $SiO_2$ layer 14 in the fourth process, further forming a third $SiO_2$ layer thereon and forming the second opening 15, and forming a third polysilicon layer on the entire surface including the second opening 15.

By repeating similar processes, it is of course possible to form storage electrodes having four or more fins.

(Second Embodiment)

Figure 3:
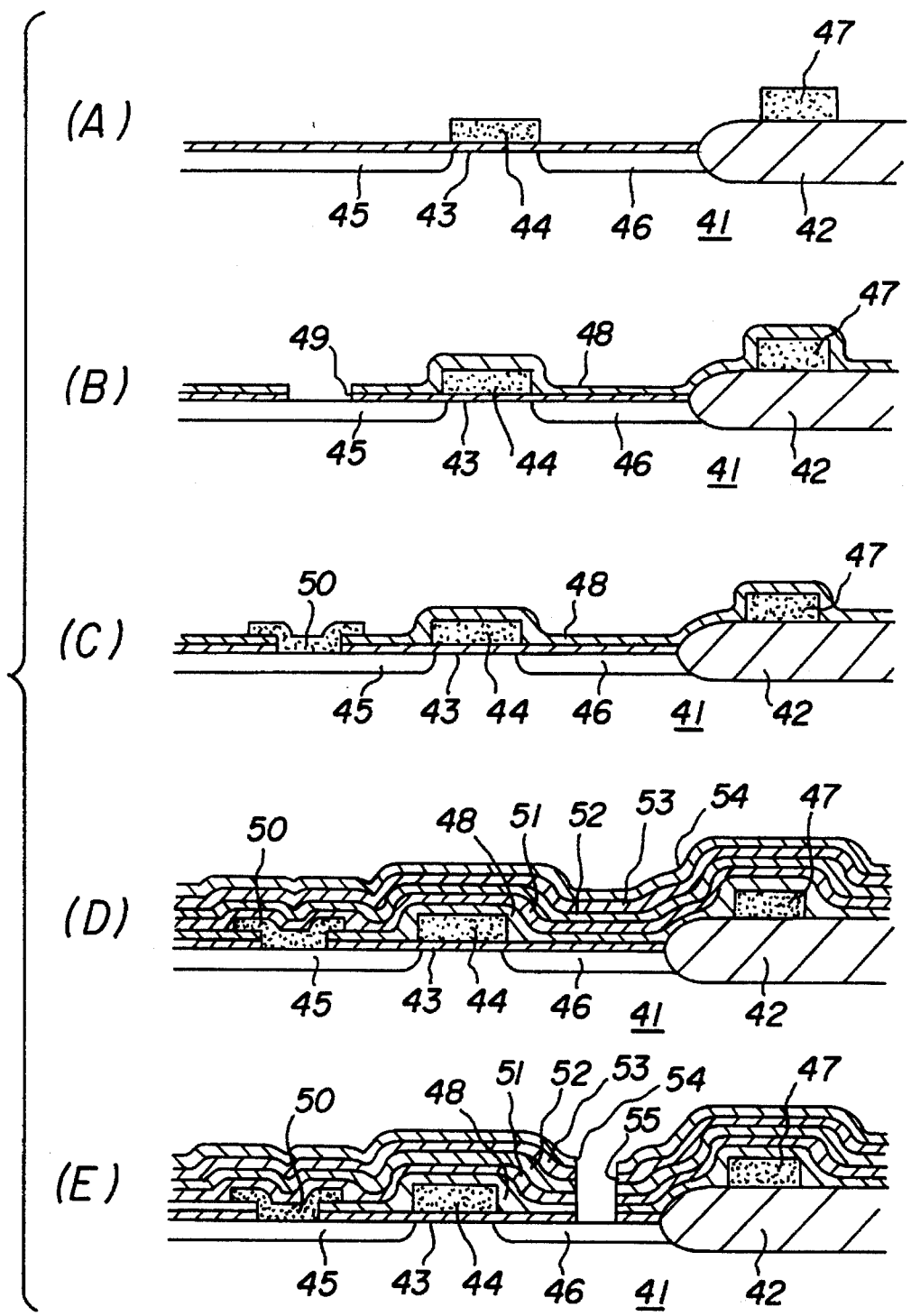
FIG. 3 in parts (A) through (E) and FIG. 4 in parts (A) through (C) are cross sectional views for explaining the process of producing the DRAM having the conventional fin type capacitor.

In the first embodiment described above, the part (52 of FIG. 3 (D)) corresponding to the first SiO$_2$ layer of the prior art is made of the SOG. However, as a modification of the first embodiment, the part (54 of FIG. 3 (D)) corresponding to the second SiO$_2$ layer of the prior art, that is, the second SiO$_2$ layer 14 of the first embodiment, may be formed by the SOG.

According to this embodiment, there is no possibility of short-circuiting the adjacent storage electrodes by the polysilicon layer which remains at the stepped part when patterning the polysilicon layer. In addition, because the underlayer of the photoresist layer is planarized, it is possible to uniformly coat the photoresist layer, thereby stabilizing the photolithography process and realizing a high production yield.

Next, a description will be given of a second embodiment of the method of producing the semiconductor device according to the present invention, by referring to FIGS. 9 and 10. In this embodiment, BPSG is used in place of SOG. In addition, since the first through third processes shown in FIGS. 9 (A) through (C) are the same as those of the first embodiment, a description thereof will be omitted.

Fourth Process (Refer to FIG. 9 (D)):

A BPSG layer 12 having a thickness of 1500 Å is formed by CVD on the entire surface of the Si$_3$N$_4$ layer 11. Then, a thermal process is carried out at 900° C. for 10 minutes, so as to reflow the BPSG layer 12. As a result, the BPSG layer 12 which is obtained has a planar (flat) surface which is approximately parallel to the surface (top surface) of the substrate 1.

The surface of the BPSG layer 12 is planarized by the reflow process. However, since the BPSG layer 12 is formed sufficiently thick so as to planarize the stepped part, it is necessary to etch back the BPSG layer 12 to a predetermined thickness. For example, a plasma etching is made with respect to the entire surface of the BPSG layer 12 to make this etch back. The plasma etching of the BPSG layer 12 is stopped at a thickness which covers at least the conductor layer underneath, so as to adjust the BPSG layer 12 to the predetermined thickness.

In addition, the polysilicon layer 13 having a thickness of 500 Å and the SiO$_2$ layer 14 having a thickness of 500 Å are successively grown on the BPSG layer 12 by CVD.

The fifth process (Refer to FIG. 9 (E)) through the eighth process (Refer to FIG. 10 (C)) are the same as those of the first embodiment except that the BPSG layer 12 is used in place of the SOG layer, and a description thereof will be omitted.

Of course, it is possible to use PSG or BSG in place of the BPSG.

Figure 11:
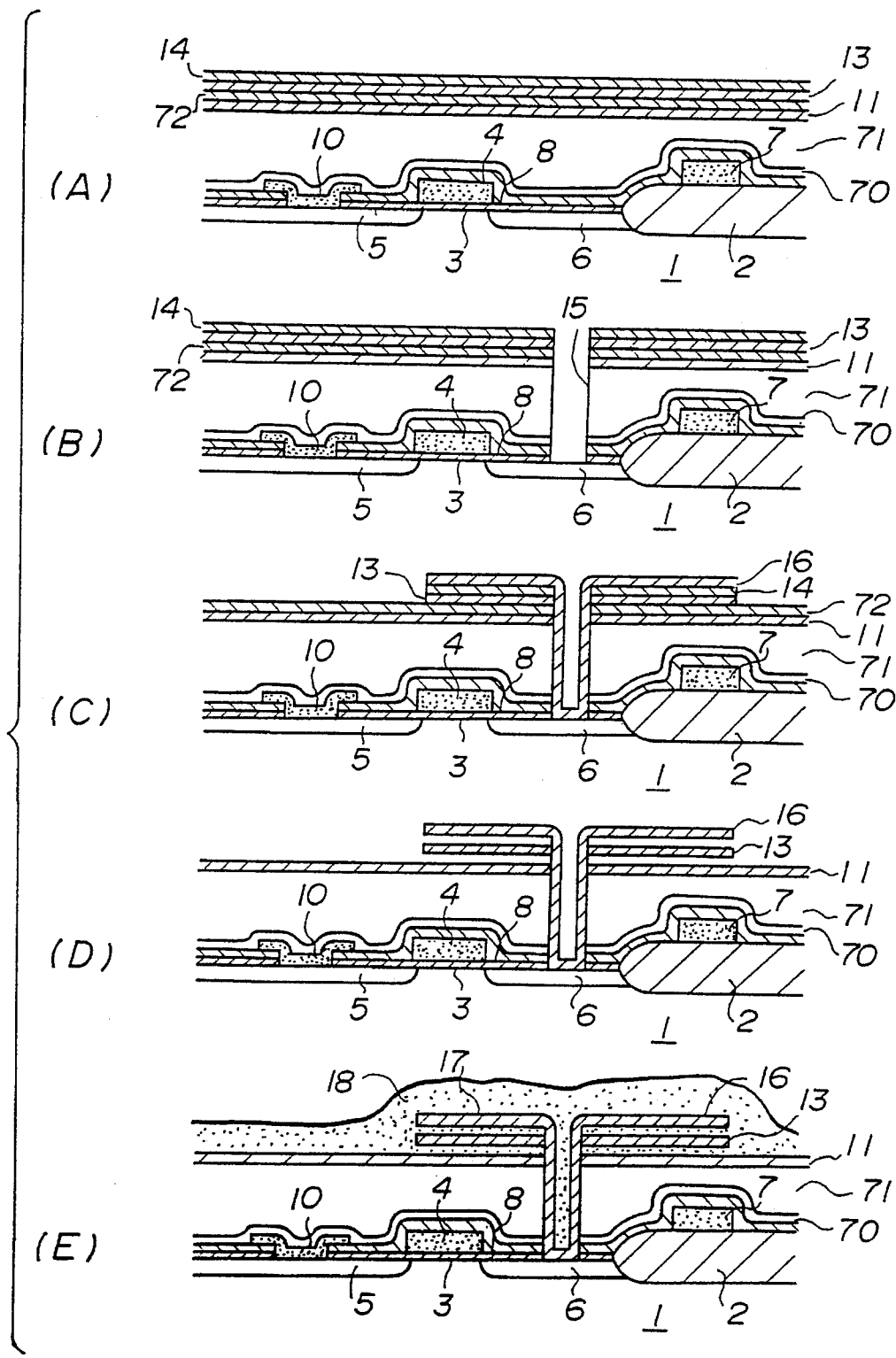
FIG. 11 in parts (A) through (E) is a cross sectional view for explaining production processes of third and fourth embodiments of the method of producing the semiconductor device according to the present invention.

Next, a description will be given of a third embodiment of the method of producing the semiconductor device according to the present invention, by referring to FIG. 11. In FIG. 11, those parts which are the same as those corresponding parts in FIGS. 9 and 10 are designated by the same reference numerals, and a description thereof will be omitted. Further, the first through third processes are the same as those of the first embodiment shown in FIG. 9 (A) through (C), and a description thereof will be omitted.

Fourth Process (Refer to FIG. 11 (A)):

An oxide layer 70 having a thickness of 300 Å is formed on the entire surface of the interlayer insulator 8 by CVD. However, this oxide layer 70 may be omitted. Thereafter, a BPSG layer 71 having a thickness of 1500 Å is formed on the entire surface of the oxide layer 70, and a thermal process is carried out at 900° C. for 10 minutes to reflow the BPSG layer 71. As a result, it is possible to obtain the BPSG layer 71 which has a planar (flat) surface which is approximately parallel to the surface (top surface) of the substrate 1. In addition, the Si$_3$N$_4$ layer 11 and a SiO$_2$ layer 72 respectively having a thickness of 500 Å are successively grown on the BPSG layer 71 by CVD.

Fifth Process (Refer to FIG. 11 (B)):

The SiO$_2$ layer 14, the polysilicon layer 13, the SiO$_2$ layer 72, the Si$_3$N$_4$ layer 11, the BPSG layer 71, the oxide layer 70, the interlayer insulator 8 and the gate oxide layer 3 on the drain region 6 are etched using the same resist mask, so as to form the opening 15 for the contact part of the storage electrode.

Sixth Process (Refer to FIG. 11 (C)):

The polysilicon layer 16 having a thickness of 500 Å is formed by CVD on the entire surface including the opening 15. In addition, the polysilicon layer 16, the SiO$_2$ layer 14 and the polysilicon layer 13 are successively etched to pattern the same to a predetermined shape.

Seventh Process (Refer to FIG. 11 (D)):

The SiO$_2$ layers 14 and 72 are removed by an isotropic wet etching using HF solution, so as to form the fin type storage electrodes which are made up of the polysilicon layers 16 and 13. The Si$_3$N$_4$ layer 11 acts as the stopper with respect to the HF etching.

Eighth Process (Refer to FIG. 11 (E)):

The dielectric layer 17, which is made up of a stacked layer of a Si$_3$N$_4$ layer having a thickness of 50 Å and a silicon oxide layer having a thickness of 10 Å, is formed on the surfaces of the fin type storage electrodes which are made up of the polysilicon layers 16 and 13. The Si$_3$N$_4$ layer is formed by CVD, and the silicon oxide layer is formed by thermal oxidation. Thereafter, a conductive polysilicon layer having a thickness of 1000 Å is deposited by CVD so as to form the opposing electrode 18, and the fin type capacitor cell is completed.

When increasing the number of fins so as to increase the capacitance of the capacitor., a polysilicon layer and a SiO$_2$ layer are successively grown after forming the SiO$_2$ layer 14 in the fourth process (FIG. 11 (A)) a number of times depending on the desired number of fins.

Next, a description will be given of a fourth embodiment of the method of producing the semiconductor device according to the present invention, by referring to FIG. 11. In this embodiment, SOG is used in place of BPSG. In addition, since the first through third processes are the same as those of the first through third embodiments shown in FIG. 9 (A) through (C), a description thereof will be omitted.

Fourth Process (Refer to FIG.11 (A)):

Similarly as in the case of the third embodiment, the oxide layer 70 having a thickness of 300 Å is formed on the entire surface of the interlayer insulator 8 by CVD. However, it is not essential that this oxide layer 70 is provided. Thereafter, the SOG layer 71 having a thickness of 500 Å is spin-coated on the entire surface of the oxide layer 70. In this case, no thermal process is necessary to carry out a reflow process as in the case where the BPSG is used.

The processes carried out thereafter are basically the same as those of the third embodiment, and a description thereof will be omitted.

In this embodiment, the SOG which used for the planarization is removed at the end, and no problem will occur although the characteristic of the SOG may be insufficient as an insulator.

Figure 12:
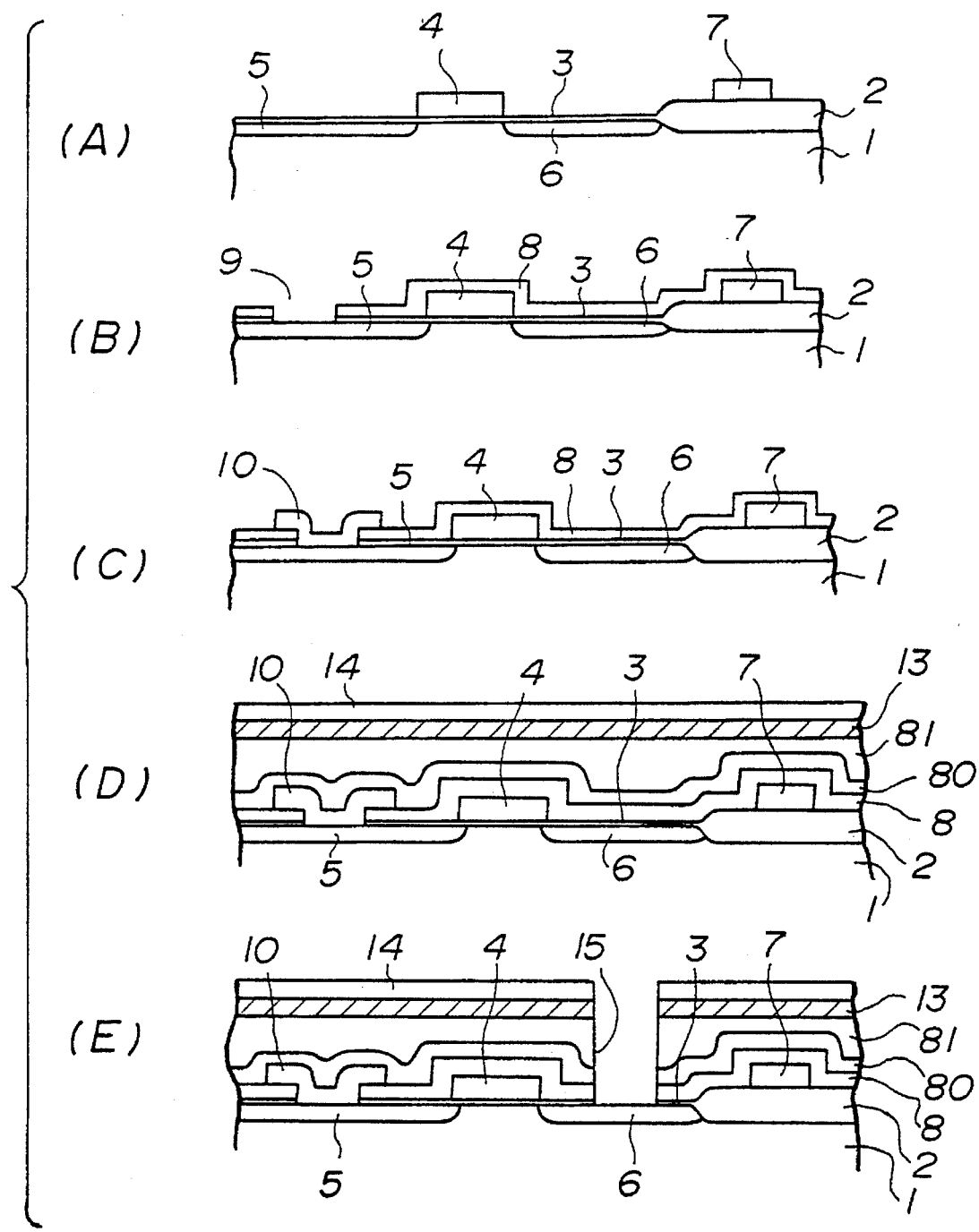
FIG. 12 in parts (A) through (E) and FIG. 13 in parts (A) through (C) are cross sectional views for explaining production processes of a fifth embodiment of the method of producing the semiconductor device according to the present invention.
Figure 13:
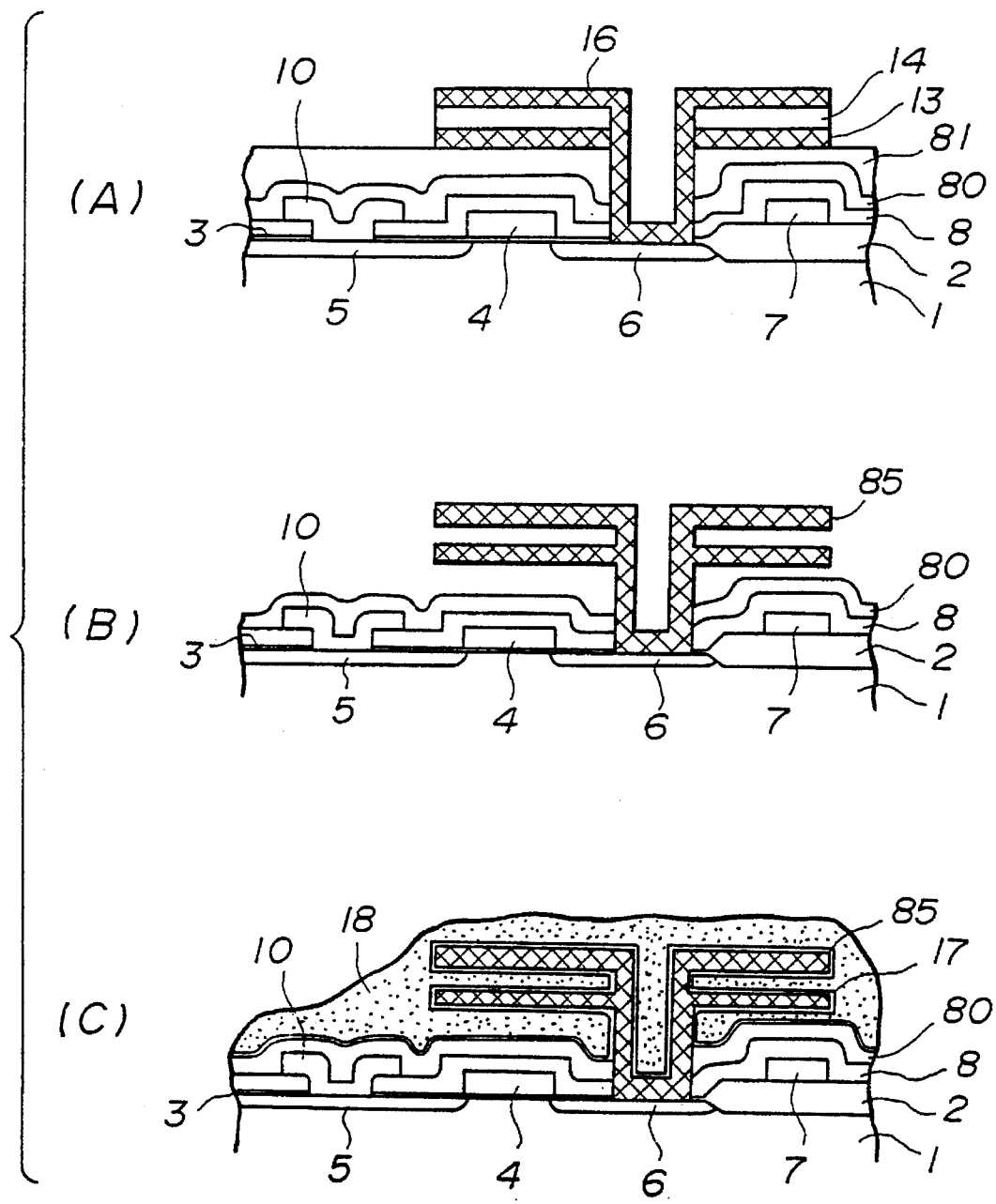

Next, a description will be given of a fifth embodiment of the method of producing the semiconductor device according to the present invention, by referring to FIGS. 12 and 13. In FIGS. 12 and 13, those parts which are essentially the same as those corresponding parts in FIGS. 9 and 10 are designated by the same reference numerals. Further, FIGS. 12 and 13 respectively show the cross section along the line X–X' in FIG. 2 which shows the plan view of a part of the DRAM. Although FIG. 2 shows the plan view of the part of the conventional DRAM, the plan view in this embodiment is the same as that shown in FIG. 2.

In FIGS. 12 and 13, there are shown a p-type silicon substrate 1, a $SiO_2$ layer 2, a gate oxide ($SiO_2$) layer 3, n-type diffusion layers 5 and 6, gate electrodes 4 and 7, a $SiO_2$ layer 8, a conductor layer 10, a $SiO_2$ layer 80, a polyimide layer 81, a polysilicon layer 13, a polyimide layer 14, a polysilicon layer 16, a storage electrode 85, a dielectric layer 17, and an opposing electrode 18.

First Process (Refer to FIG. 12 (A)):

The $SiO_2$ layer 2 which has a thickness of 3000 Å and becomes the field insulator layer is formed on the p-type silicon substrate 1 by a known LOCOS method. Thereafter, the $SiO_2$ layer 3 which has a thickness of 100 Å and becomes the gate oxide layer is formed on the entire surface by thermal oxidation. Next, a polysilicon layer having a thickness of 1500 Å is formed on the entire surface by CVD, and the polysilicon layer is selectively removed by use of a patterned resist mask (not shown) so as to form the gate electrodes 4 and 7. The gate electrodes 4 and 7 become word lines.

In addition, arsenic ions ($As^+$) are injected into the silicon substrate 1 using the gate electrode 4 as a mask. A thermal diffusion is made thereafter so as to form the $n^+$-type impurity diffusion layers 5 and 6. The $n^+$-type impurity diffusion layers 5 and 6 become the source/drain of a transfer transistor.

Second Process (Refer to FIG. 12 (B)):

The $SiO_2$ layer 8 having a thickness of 1000 Å is formed on the entire surface by CVD. Then, the $SiO_2$ layers 3 and 8 are selectively removed using a patterned resist mask (not shown), so as to form the opening 9.

Third Process (Refer to FIG. 12 (C)):

A polysilicon layer having a thickness of 500 Å and a tungsten silicide layer having a thickness of 1000 Å are successively formed on the entire surface by CVD. Then, the polysilicon layer and the tungsten silicide layer are selectively etched and removed using a patterned resist mask (not shown) so as to form the conductor layer 10 which becomes the bit line.

Fourth Process (Refer to FIG. 12 (D)):

The $SiO_2$ layer 80 which has a thickness of 500 Å and is used as an insulator layer is formed on the entire surface by CVD. Thereafter, the polyimide layer 81 having a thickness of 500 Å is coated on the entire surface by spin-coating. Next, the polysilicon layer 13 which has a thickness of 500 Å and becomes the storage electrode is formed on the entire surface by CVD. In addition, the polyimide layer 14 having a thickness of 500 Å is coated on the entire surface by spin-coating.

Fifth Process (Refer to FIG. 12 (E)):

The polyimide layer 14, the polysilicon layer 13, the polyimide layer 81, and the $SiO_2$ layers 80, 8 and 3 are successively and selectively etched using a patterned resist mask (not shown), so as to form the opening 15.

Sixth Process (Refer to FIG. 13 (A)):

The polysilicon layer 16 which has a thickness of 500 Å and becomes the storage electrode is formed on the entire surface by CVD. Then, the polysilicon layer 16, the polyimide layer 14 and the polysilicon layer 13 are successively and selectively etched by an anisotropic etching using a patterned resist mask (not shown).

Seventh Process (Refer to FIG. 13 (B)):

By removing the polyimide layers 14 and 81 by plasma ashing within an oxygen atmosphere, the storage electrode 85 having the storage electrode area of the memory cell three-dimensionally stacked is completed. In this state, the $SiO_2$ layer 80 acts as a mask with respect to the plasma ashing, and will not be removed.

Eighth Process (Refer to FIG. 13 (C)):

A $Si_3N_4$ layer having a thickness of 50 Å is formed on the entire surface by CVD. Then, a $SiO_2$ layer having a thickness of 20 Å is formed on the entire surface by thermal oxidation, so as to form the dielectric layer 17. Further, a polysilicon layer which is doped with impurity ions is formed on the entire surface by CVD, and the opposing electrode 18 is formed by patterning this doped polysilicon layer. Thereafter, the fin type capacitor is completed by carrying processes such as forming the interlayer insulator and the wiring layer.

In this embodiment, polyimide is used in order to form a fine which does not have concavo-convex parts. However, it is possible to use other materials such as polymer resins which can be spin-coated, has a high selective etching ratio with respect to polysilicon and oxide layers, and is head resistant so that it can withstand the high temperature at the time of thermal annealing or the like. In addition, the number of fins is not limited to two, and may be an arbitrary number.

Furthermore, although this embodiment forms the fin on the $n^+$-type impurity diffusion layer 6 which becomes the source/drain of the transfer transistor, the location of the fin is not limited to this case. For example, a draw-out electrode may be provided from the $n^+$-type impurity diffusion layers 5 and 6, and the fin may be formed on the $SiO_2$ layer 2 which isolates the element.

In addition, it is possible to etch the polysilicon and polyimide by the plasma etching using the same etchant if a mixed gas of chlorine and oxygen is used.

Figure 7:
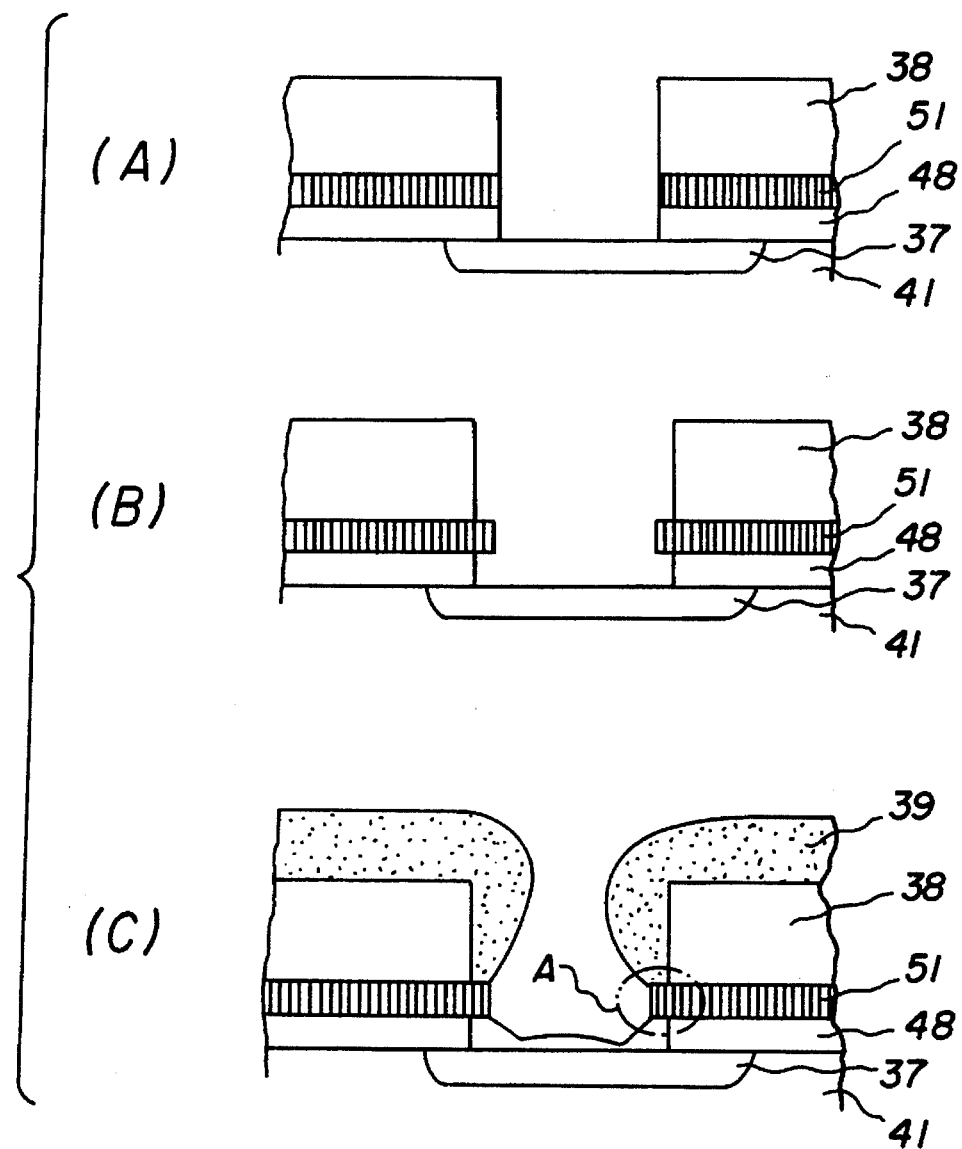
FIG. 7 in parts (A) through (C) is a cross sectional view for explaining a disconnection of an Al layer according to a conventional method.

According to this embodiment, the top fin of the storage electrode is formed to a shape which does not include concavo-convex parts. For this reason, it is possible to facilitate the process of forming the opening. In addition, no short-circuit of the adjacent storage electrodes will occur when carrying out the patterning process, because it is possible to completely etch the polysilicon layers. Moreover, since no nitride layer exists at the contact hole part, the disconnection of the Al layer described in conjunction with FIG. 7 will not occur. Accordingly, it is possible to stably produce a fine fin type capacitor cell with improved reliability and yield.

In each of the embodiments described above, the insulator, which forms the underlayer when forming the polysilicon layer which forms the capacitor fin, must be flat. However, it is possible to employ the following method, for example, other than the methods using the reflowed BPSG and PSG layers, the BSG layer, the SOG layer and the polyimide layer.

First, a nitride layer, which forms the underlayer, is formed on the entire surface by CVD. This nitride layer is used as an etching stopper layer with respect to the solution which is used at a subsequent process.

Then, an oxide layer is formed by CVD to a sufficient thickness on the CVD-formed nitride layer surface. At this stage, the surface of the oxide layer still reflects the undulations of the underlayer.

Next, a resist, which has a composition such that the etching rate is approximately the same as tat of the CVD-formed oxide layer, is spin-coated to a sufficient thickness on the CVD-formed oxide layer, so that the surface of the resist becomes planar regardless of the undulations of the underlayer. Such a resist is on the market and available.

Thereafter, the planar resist surface is uniformly etched back by plasma etching. In succession, the removal of the resist and the removal of the CVD-formed oxide layer are made, and the etch back of the CVD-formed oxide layer is stopped at an appropriate thickness. As a result, a CVD-formed oxide layer having planar surface and a desired thickness is obtained.

Then, the patterning of the opening, the depositing of the polysilicon outside the opening are carried out similarly to the above described embodiments, so that similar effects are obtained as in the above described embodiments.

In the memory cell of a large scale static random access memory (SRAM), there is a known method of producing a thin film transistor (TFT) which sandwiches a polysilicon channel by polysilicon gate electrodes by using the sidewall contact and efficiently utilizing the area. For example, IEDM Tech. Dig. (1991), p.477 proposes such a method.

Accordingly, in each of the above described embodiments, the method of etching the stacked layer of silicon oxide and polysilicon layers is not limited to the semiconductor device having the fin type capacitor, and is also applicable to the method of producing a semiconductor device having the TFT which uses the sidewall contact.

However, in the embodiments, the etching process with respect to the stacked layer which is made up of stacked silicon oxide and polysilicon layers is carried out by alternately making a silicon oxide layer etching process (having selectivity with respect to the polysilicon layer) and a polysilicon layer etching process (having selectivity with respect to the silicon oxide layer). During the etching process with respect to each layer, it is necessary to make the so-called over-etching in order to compensate for the thickness distribution of the layer and the etching speed distribution and to completely remove each layer. In addition, an anisotropic etching is used to accurately transfer the resist pattern, but an over-etching is also required to remove a residual layer which is generated at the stepped part of the underlayer structure. For these reasons, the selectivity is necessary during the etching process with respect to each layer.

In the fin type capacitor, it is necessary to reduce the cell area and to reduce the area of the storage electrode in the plan view in order to improve the integration density. For this reason, it is necessary to increase the number of fins in order to secure a sufficient surface area of the storage electrode. For example, in the case of a 256 Mbit DRAM, five or more fins are required.

However, according to the production method described above, it requires for each fin two CVD processes for forming the polysilicon layer and the silicon oxide layer, two etching processes for etching the polysilicon layer and the silicon oxide layer in order to form the contact hole, and two etching processes for etching the polysilicon layer and the silicon oxide layer in order to pattern the storage electrode. In other words, the number of required processes increases at a rate of six times the number of fins to be provided. As a result, it is difficult to produce the device at a low cost.

In addition, defective parts caused by particles generated at each process accumulates and the yield and the reliability both become poorer as the number of processes increases. This problem may be eliminated to a certain extent by employing a multi-chamber production apparatus which successively etches the silicon oxide layer in a reaction chamber exclusively therefor and etches the polysilicon layer in a reaction chamber exclusively therefor by transporting the structure under vacuum. But such a multi-chamber production apparatus is extremely large and expensive, thereby making the production cost still high.

Hence, a description will now be given of embodiments of the method of producing the semiconductor device according to the present invention, in which the number of production processes can be reduced considerably and both the yield and reliability can be improved.

Figure 14:
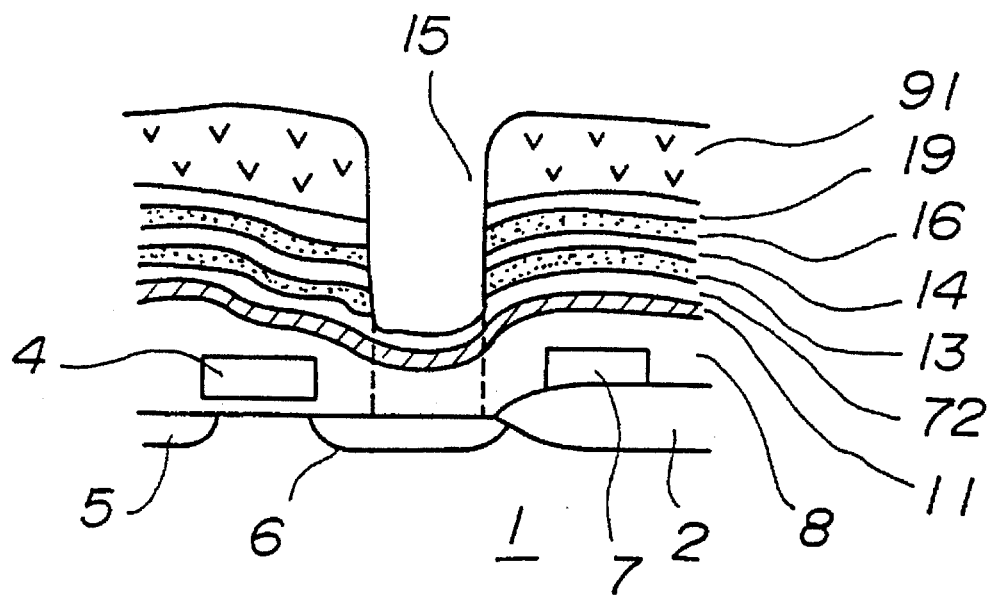
FIG. 14 is a cross sectional view for explaining a sixth embodiment of the method of producing the semiconductor device according to the present invention.

First, a description will be given of a sixth embodiment of the method of producing the semiconductor device according to the present invention, by referring to FIG. 14. In FIG. 14, those parts which are essentially the same as those corresponding parts in FIGS. 9 and 10 are designated by the same reference numerals, and a description thereof will be omitted.

As shown in FIG. 14, after forming an element isolation structure 2, a transfer transistor, a word line 4 and a bit line on a silicon substrate 1, a silicon oxide layer 8 having a thickness of 400 Å and a silicon nitride layer 11 having a thickness of 400 Å are formed by CVD. In addition, a silicon oxide layer having a thickness of 300 Å and a polysilicon layer having a thickness of 300 Å are alternately stacked (two times in this embodiment) by CVD to form silicon oxide layers 72 and 14 and polysilicon layers 13 and 16. A silicon oxide 19 having a thickness of 300 Å is formed thereafter. Then, a resist layer 91 is coated on the entire surface, and the resist layer 91 is patterned to the shape of a contact hole. Next, the silicon oxide layers 14 and 72 and the polysilicon layers 16 and 13 are etched at approximately the same speed by RIE using $CF_4$ as the reactive gas. Light emission of CO is monitored, and the etching is stopped at a point in time when the etching of the silicon oxide layer 72 progresses to approximately one-half.

When the silicon oxide layer is being etched, increased light emission of CO and the like is observed if the light emission spectral of the etching plasma is analyzed. In addition, decreased light emission of F is observed when the polysilicon layer is being etched. Accordingly, it is possible to accurately control the amount of etching by making the etching while monitoring the progressed state of the etching as shown in FIG. 15.

Figure 15:
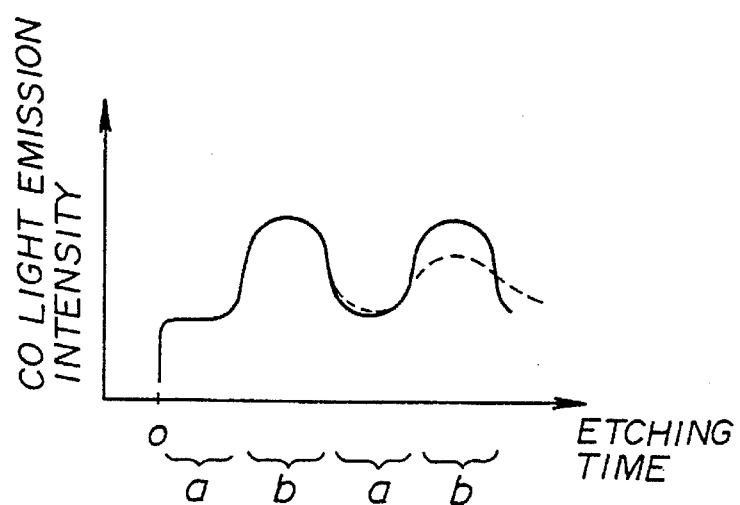
FIG. 15 is a diagram showing a monitored result of an etching state obtained by plasma light emission spectrum analysis.

In FIG. 15, the ordinate indicates the CO light emission intensity, the abscissa indicates the etching time, a time a indicates the etching time of the polysilicon layer, and a time h indicates the etching time of the silicon oxide layer. In addition, a dotted line in FIG. 15 shows a case where a stepped part exists at the surface and the area occupied by a sloping surface is large. In this case, the change in the CO generation decreases as the etching progresses as indicated by the dotted line. For this reason, it is desirable to make the planarization as in each of the embodiments described above.

Next, an etching process (selective ratio with respect to silicon is approximately 10) is carried out with respect to the silicon oxide layer using CF$_4$+CHF$_3$, and an opening 15 which reaches the silicon substrate 1 is formed as indicated by a dotted line in FIG. 14.

For example, when forming a capacitor having five fins in the above described manner, this embodiment only requires two processes (forming the contact hole 15 and patterning the fins) as opposed to nine etching processes which are required if the selective etching is employed, and the number of production processes can be reduced considerably.

Figure 16:
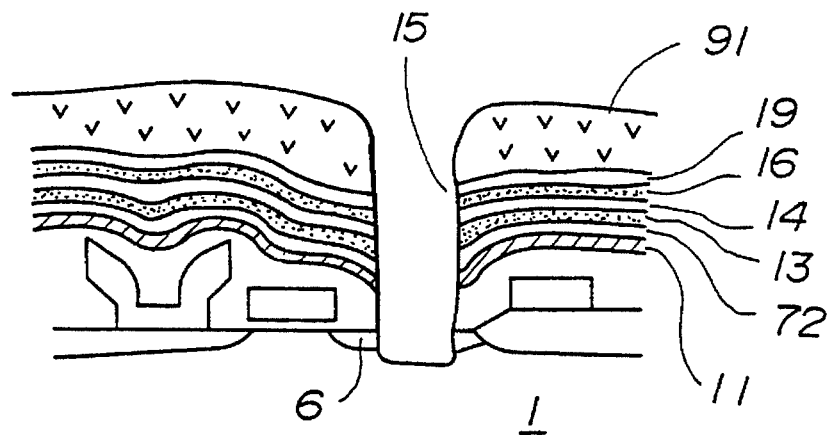
FIG. 16 is a cross sectional view for explaining a problem which occurs when forming a contact hole.

According to the method of etching the stacked layer which is made up of the silicon oxide layer and the polysilicon layer under the condition that the etching speed of the silicon oxide layer and the etching speed of the polysilicon layer are approximately the same, the contact hole 15 may penetrate the thin source/drain diffusion layer 6 of the silicon substrate 1 as shown in FIG. 16. In this case, the intended contact cannot be achieved. In FIG. 16, those parts which are the same as those corresponding parts in FIG. 14 are designated by the same reference numerals, and a description thereof will be omitted.

Figure 18:
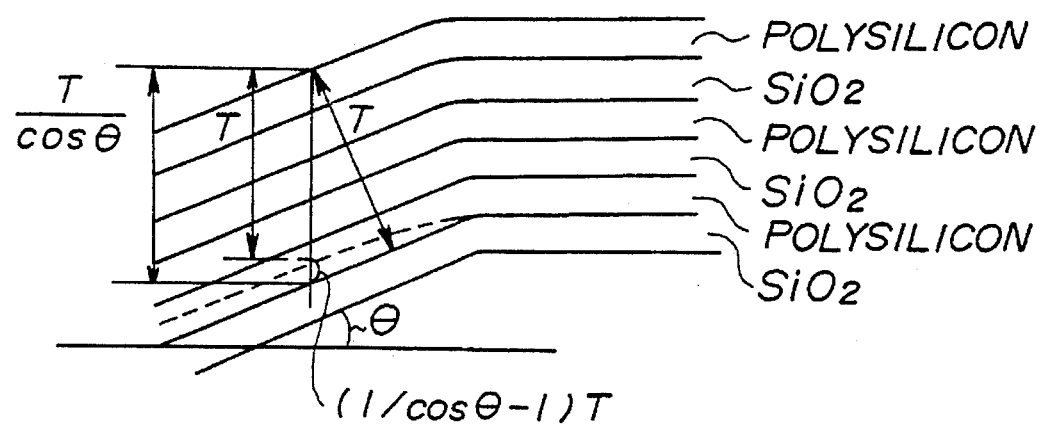
FIG. 18 is a diagram for explaining a residual layer on a stepped part.

However, the problem of FIG. 18 can positively be prevented by carrying out the etching at the same speed for the silicon oxide and polysilicon layers of the stacked layer until the etching of the lowermost polysilicon layer 13 ends, and then selectively etching the silicon oxide layer 72. If the underlayer structure of the region where the contact hole 15 is to be formed includes a stepped part, it is desirable to continue the etching at the same speed for the silicon oxide and polysilicon layers of the stacked layer until the lowermost polysilicon layer 13 is completely removed.

Figure 17:
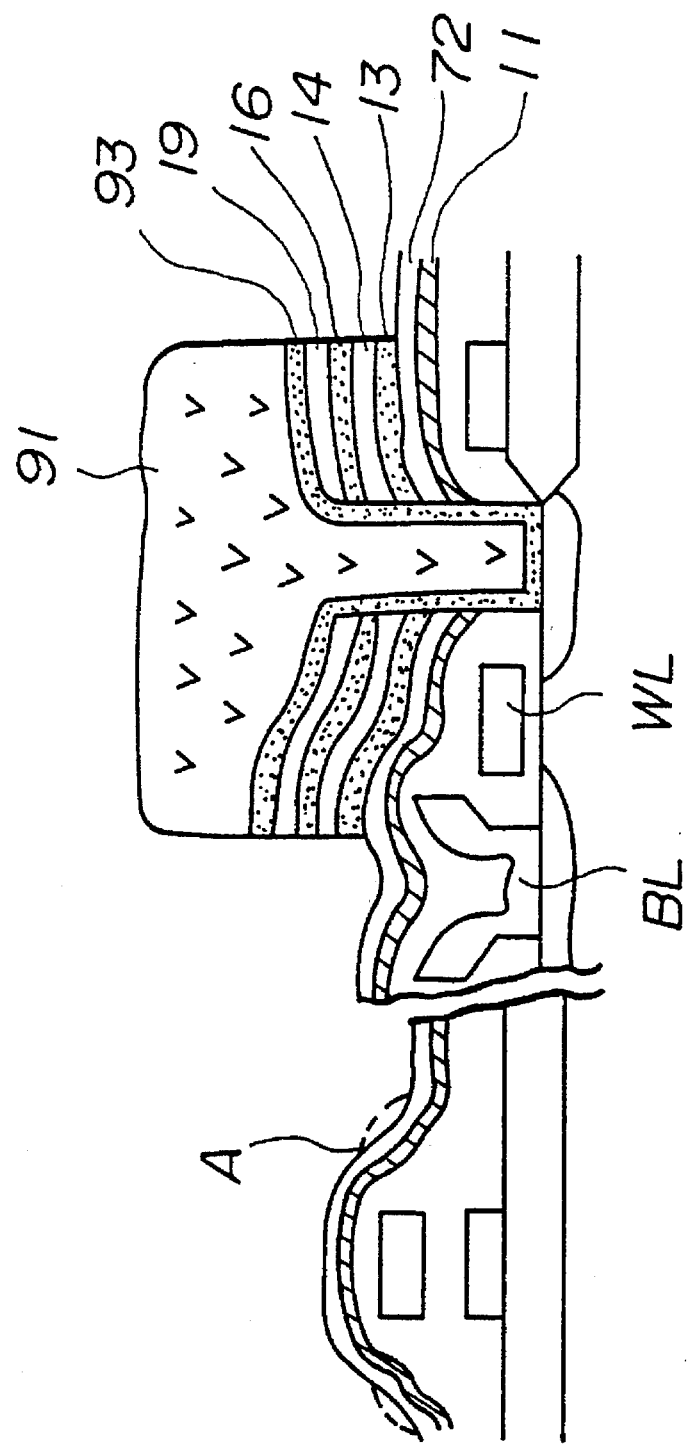
FIG. 17 is a cross sectional view for explaining the formation of a fin structure.

When forming the storage electrode by patterning the stacked layer of the silicon oxide layer and the polysilicon layer, a residual layer may be generated due to the stepped part beneath the stacked layer as indicated by 'A' on the left side of FIG. 17. When removing the silicon oxide layer between the fins which form the storage electrode using hydrofluoric acid, the residual polysilicon layer will lift off and become the source of defects. For this reason, it is necessary to eliminate this problem when forming the storage electrode.

In FIG. 17, those parts which are essentially the same as those corresponding parts in FIG. 14 are designated by the same reference numerals, and a description thereof will be omitted. In this case, since there are three fins, a polysilicon layer 93 is formed on the silicon oxide layer 19. BL denotes a bit line, and WL denotes a word line.

If a stepped part having an angle θ exists on the underlayer, a residual layer having a thickness (1/cosθ–1)·T in a direction perpendicular to the substrate surface is generated at the stepped part as shown in FIG. 18 when an anisotropic etching is made to etch the stacked layer having a total thickness T. If the angle θ is large, the stacked layer of the silicon oxide layer and the polysilicon layer will remain, and the silicon oxide layer etching is required in order to remove this residual stacked layer. However, because the stacked layer (generally, the silicon oxide layer) underneath is already exposed at the flat part, there is a problem in that the underlayer structure will be etched when etching the silicon oxide layer.

Hence, in a seventh embodiment of the method of producing the semiconductor device according to the present invention, this problem is overcome by taking the following measures. That is, if the total thickness of the stacked layer is T and the lowermost polysilicon layer has a thickness t, the method includes a process of approximately planarizing the structure beneath the stacked layer so that a maximum angle θ of the stepped part satisfies the following formula (1).

$$\theta < \cos^{-1}(1-t/T) \quad (1)$$

By providing this process, the thickness of the residual layer in the direction perpendicular to the substrate surface becomes less than t/cosθ. In other words, the residual layer is made up solely of the polysilicon layer, thereby making it possible to easily remove the residual layer by the polysilicon layer etching process which has a slow etching speed with respect to the silicon oxide layer.

The formula (1) can be derived in the following manner. The vertical direction component of the thickness of the residual layer generated at the stepped part is (1/cosθ–1)·T as shown in FIG. 18. In addition, since the thickness of the lowermost polysilicon layer is t, its vertical direction component is t/cosθ.

Here, the object is to make the residual layer generated at the stepped part be made up solely of the polysilicon layer. Hence the following should be satisfied to achieve this object.

$$(1/\cos\theta - 1)\cdot T < t/\cos\theta$$

The formula (1) is thus obtained by transforming the above as follows.

$$(1-\cos\theta)\cdot T < t$$

$$1-\cos\theta < t/T$$

$$\cos\theta > 1 - t/T$$

Therefore, $\theta < \cos^{-1}(1-t/T)$

In this embodiment, when forming a fine type capacitor having five fins and in which the thicknesses of the silicon oxide layer and the polysilicon layer are the same, a planarization is made by coating SOG after forming the bit line, and the angle θ formed by the surface undulation and the substrate surface is made 27° or less. Of course, it is desirable that the angle θ is set even smaller.

Subsequent to forming the contact hole 15 in the sixth embodiment, a polysilicon layer 93 having a thickness of 300 Å is formed by CVD as shown in FIG. 17. In addition, after coating a resist layer 91 on the entire surface, the resist layer 91 is patterned to the shape of the storage electrode. Then, the resist layer 91 is used as a mask, and the stacked layer which is made up of the silicon oxide layers 19, 14 and 72 and the polysilicon layers 93, 16 and 13 is etched by RIE using CF$_4$. This etching is made until the polysilicon layer 13 at the flat part is just removed. In this state, there is a possibility that only the polysilicon layer 13 remains at the stepped part as indicated by 'A' on the left side of FIG. 17. Hence, the residual polysilicon layer is etched by RIE using HBr, for example. As a result, it is possible to completely remove the polysilicon layer 13 by maintaining almost all of the silicon oxide layer 72 on the silicon nitride layer 11, as indicated on the right side of FIG. 17.

According to this embodiment, when forming the capacitor having five fins, only two processes (forming the contact hole 15 and patterning the fins) are required as opposed to nine etching processes which are required in the production method using the selective etching, and the number of required production processes can be reduced considerably, similarly to the sixth embodiment.

If the planarization using SOG is made, it may affect the metal wiring contact. For this reason, after forming the opposing electrode of the capacitor and removing the silicon nitride layer, the SOG may be removed if necessary. In this case, the removal of the SOG is facilitated if the selected SOG has an extremely high etching speed when HF is used. On the other hand, it is possible to select a fine SOG such that the problem of affecting the metal wiring contact is avoided.

Next, a description will be given of an eighth embodiment of the method of producing the semiconductor device according to the present invention.

Figure 19:
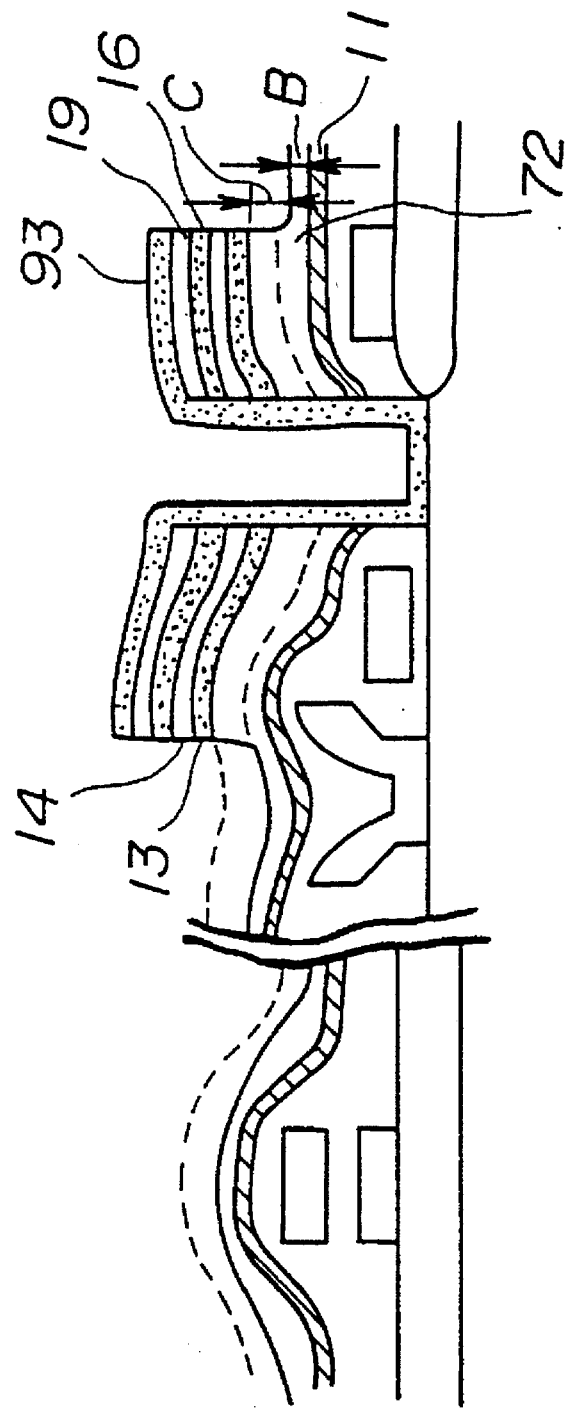
FIG. 19 is a cross sectional view for explaining an eighth embodiment of the method of producing the semiconductor device according to the present invention.

If the angle θ in the seventh embodiment is relatively large, the silicon oxide layer 72 on the silicon nitride layer 11 will be etched when the etching is made to remove the residual layer at the stepped part. For this reason, this embodiment uses a thick silicon oxide layer 72 as shown in FIG. 19. In FIG. 19, those parts which are the same as those corresponding parts in FIG. 17 are designated by the same reference numerals, and a description thereof will be omitted.

When forming a capacitor having five fins by forming each of the silicon oxide layers 14 and 19 and the polysilicon layers 13, 16 and 93 to a thickness of 300 Å in a case where the angle θ of the stepped part is 30°, for example, a silicon oxide layer 72 having a thickness of approximately 620 Å is formed on the silicon nitride layer 11 as shown in FIG. 19. This thickness of approximately 620 Å includes a thickness B of 200 Å required to protect the silicon nitride layer 11, and a thickness C of approximately 420 Å which is provided for the over-etching. In this case, $(1/\cos\theta-1)\cdot T \approx 420$ Å because θ=30° and T=2700 Å.

Thereafter, the polysilicon layers 13, 16 and 93 respectively having the thickness of 300 Å and the silicon oxide layers 14 and 19 respectively having the thickness of 300 Å are alternately formed.

When forming the storage electrode, the polysilicon and silicon oxide layers are etched at the same etching speed by RIE using $CF_4$ as the etchant gas. The residual later at the stepped part is completely removed by carrying out an over-etching amounting to 420 Å after the etching of the last polysilicon layer 13 ends. Since the silicon oxide layer 72 amounting to 200 Å remains on the silicon nitride layer 11, it is possible to prevent the structure underneath from being damaged by a HF process which is carried thereafter.

In this embodiment, only one process (patterning the fins) is required to form the capacitor having five fins as opposed to nine etching processes which are required in the method which uses the selective etching, and the number of required production processes can be reduced considerably.

Next, a description will be given of a ninth embodiment of the method of producing the semiconductor device according to the present invention.

In this embodiment, if the angle θ of the stepped part is 35°, for example, when patterning the storage electrode of the fin type capacitor, the etching of the polysilicon and silicon oxide layers at the same etching speed is stopped after etching three polysilicon layers and two silicon oxide layers because the normalized thickness of the stepped part in the vertical direction is $1/(1-\cos\theta)=5.5$. In this state, the silicon oxide layer is exposed at the flat part. Hence, the polysilicon layer at the stepped part is removed by a polysilicon layer etching process using HBr. It is sufficient that the amount of the polysilicon layer etching corresponds to one silicon oxide layer.

Next, the etching at the same etching speed is stopped after etching one polysilicon layer. Finally, a polysilicon layer etching using HBr is made to remove the polysilicon layer at the stepped part, and the etching process is thereby completed.

According to this embodiment, it is possible to reduce the number of etching process to four from nine etching processes which are required when the selective etching is used.

In the embodiments described above, $CF_4$ is used as an example of the etchant gas which enables the etching of the polysilicon and silicon oxide layers at the same etching speed. However, it is possible to use other etchant gases as long as the silicon oxide layer and the polysilicon layer are anisotropically etched at approximately the same etching speed.

In addition, it is possible to planarize the underlayer by reflowing BPSG or carrying out $TEOS/O_3$ CVD. Furthermore, the number of fins may be selected depending on the characteristic of the device, and the combination of the etching conditions may be easily selected within the scope of the present invention.

The HBr plasma etching is explained as an example of the selective etching of the polysilicon layer, however, it is possible to use Cl or F system etching. In addition, the selective etching of the silicon oxide layer is not limited to that using $CF_4+CHF_3$, and it is possible to use $CF_4+CH_2F_2$, $CF_4+C_4F_8+CH_2F_2$ or the like.

Moreover, although RIE is used for the etching process in the described embodiments, it is possible to obtain satisfactory results using a process carried out under a magnetic field such as ECR.

The method of controlling the amount of etching is not limited to monitoring the plasma light emission, and other methods such as changing the pressure, changing the electrode voltage and employing the light interference may also be used.

Next, a description will be given of a first embodiment of a semiconductor device according to the present invention.

Figure 4:
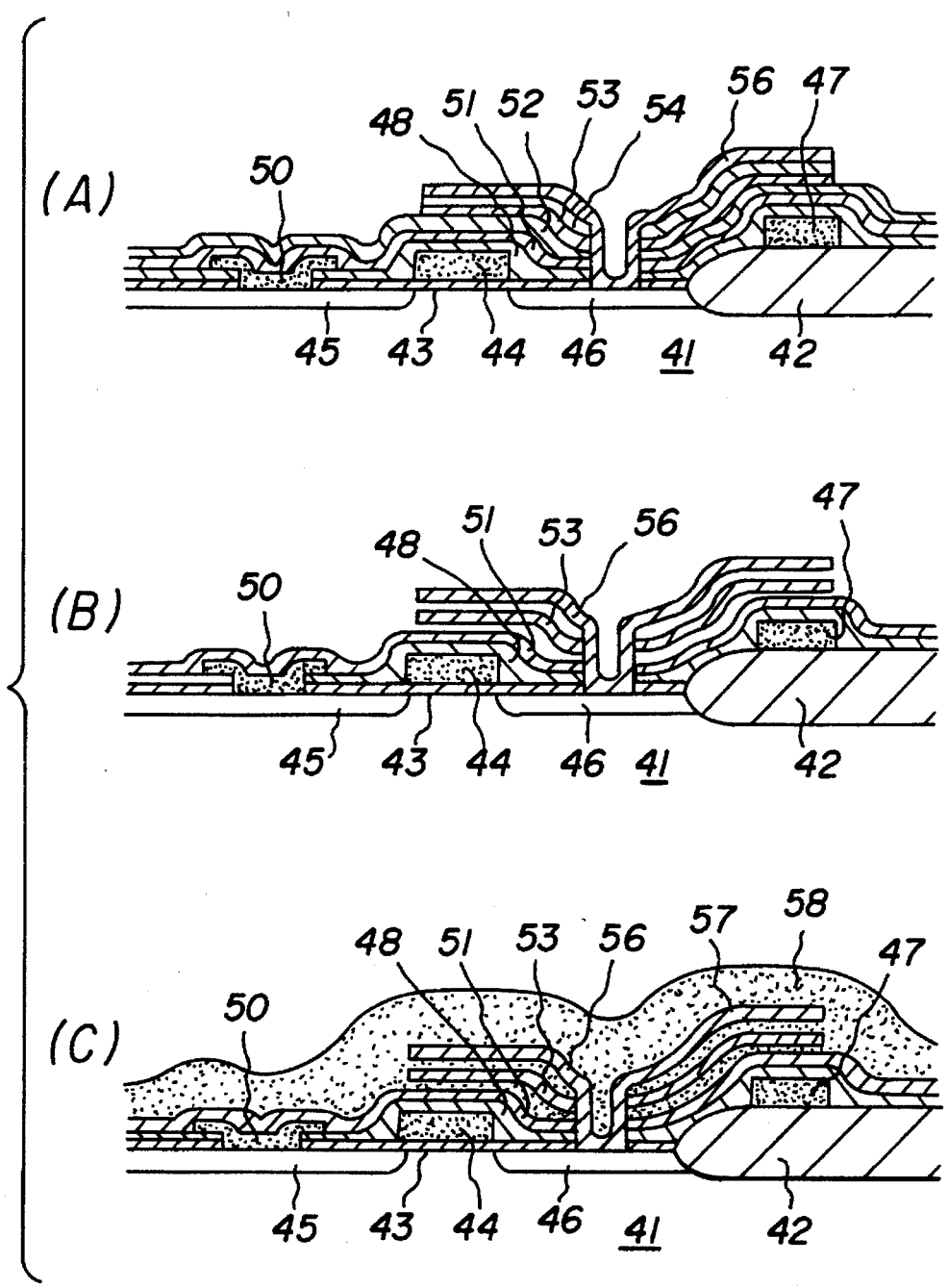
Figure 5:
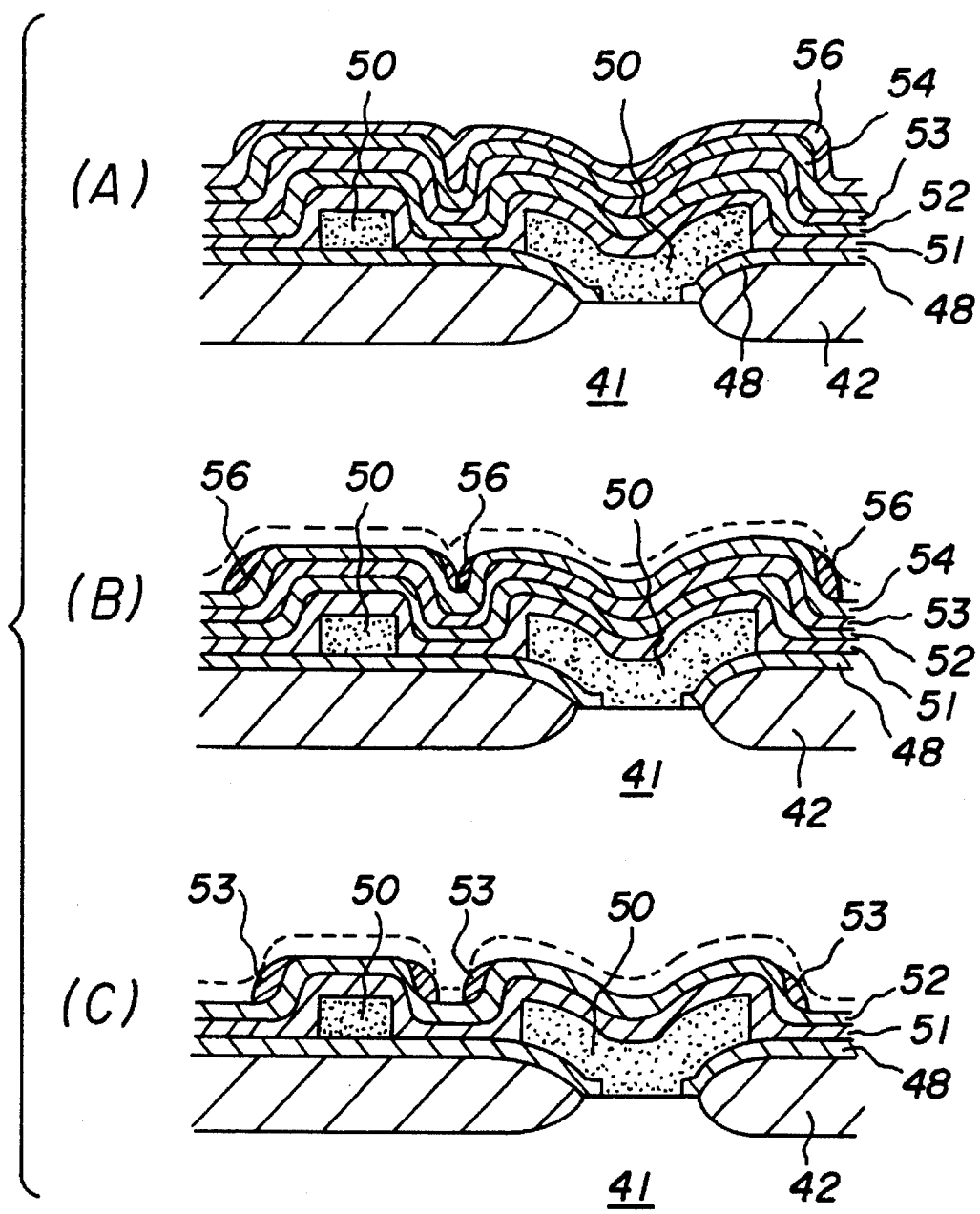
FIG. 5 in parts (A) through (C) is a cross sectional view for explaining a patterning process of a storage electrode according to a conventional method.

This first embodiment of the semiconductor device has the structure shown in FIG. 10 (C). In other words, the conductor layers 13 and 16 which form the fins of the fin type capacitor respectively extend approximately parallel to the surface (top surface) of the substrate 1. The shape of the fins are different from that of the prior art shown in FIG. 4 (C), for example. In addition, the thickness of the opposing electrode 18 under the conductor layer 13 is not constant in this embodiment, and is thicker towards the contact hole 15. On the other hand, according to the prior art shown in FIG. 4 (C), the thickness of the opposing electrode 58 under the conductor layer 53 is approximately constant.

Second and third embodiments of the semiconductor device according to the present invention are respectively shown in FIGS. 11 (E) and 13 (C). These embodiments of the semiconductor device also have the fin features of the first embodiment of the semiconductor device. In addition, with regard to the third embodiment of the semiconductor device, the features of the opposing electrode is also the same as the first embodiment of the semiconductor device.

Figure 20A:
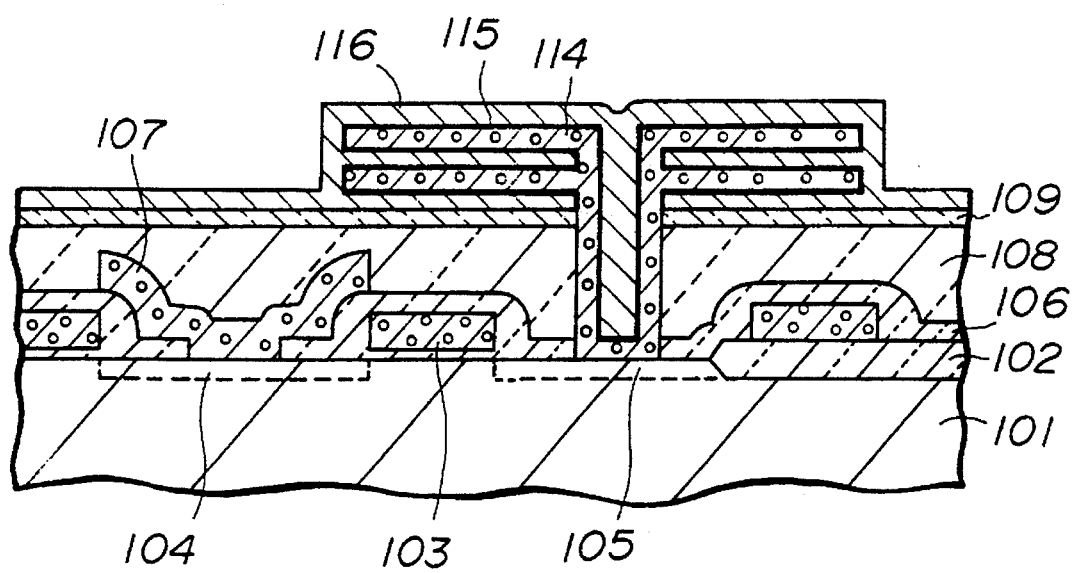
FIG. 20A is a cross sectional view showing a DRAM cell.

FIG. 20A is a cross sectional view showing the construction of a DRAM employing a fin type capacitor. In FIG. 20A, a field oxide layer 102 is formed at a predetermined region on the surface of a silicon substrate 101, so as to define an active region. A gate electrode 103 is formed in the active region via a gate insulator layer. A source region 104 and a drain region 105 are self-aligned and formed on both side of the gate electrode 103.

The gate electrode 103, the source region 104 and the drain region 105 are covered by an interlayer insulator layer 106. A bit line 107 is formed is formed at a predetermined region on the interlayer insulator layer 106, and this bit line 107 is electrically connected to the source region 104 via a hole provided above the source region 104.

A BPSG layer 108 is formed so as to cover the interlayer insulator layer 106 and the bit line 107. The surface of the BPSG layer 108 is planarized by a reflow process. A SiN layer 109 which functions as an etching stopper is formed on the surface of the BPSG layer 108.

A through hole penetrates the interlayer insulator layer 106, the BPSG layer 108 and the SiN layer 109 and reaches the surface of the drain region 105. A fin type storage electrode 114 is formed via this through hole. An opposing electrode 116 is formed on the surface of the fin type storage electrode 114 via a dielectric layer 115.

By forming the stacked structure of the fin type capacitor on the planarized surface of the BPSG layer 108, it is possible to stably carry out the photolithography and etching processes for forming the fin type storage electrode 14.

However, according to the DRAM having the construction shown in FIG. 20A, a crack may be generated in the SiN layer 109.

Figure 20B:
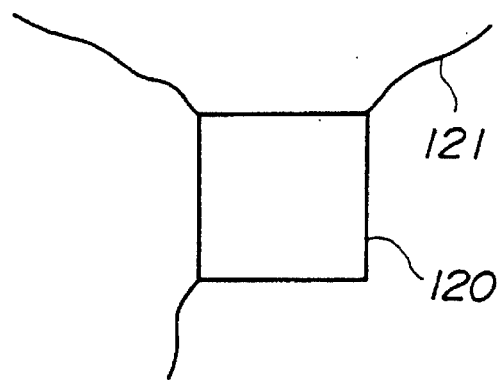
FIG. 20B is a plan view showing a through hole and a crack.

FIG. 20B is a plan view generally showing the cracks formed in the SiN layer 109. In FIG. 20B, cracks 121 are generated radially from corner portions of a through hole 120 which penetrates the interlayer insulator layer 106, the BPSG layer 108 and the SiN layer 109 shown in FIG. 20A. As shown in FIG. 20B, the cracks 121 are easily generated particularly at the corner portions of the through hole 120. These cracks 121 deteriorate the reliability of the DRAM and also deteriorate the production yield of the DRAM.

Accordingly, a description will now be given of embodiments of the semiconductor device and the method of producing the same, wherein measures are taken to prevent cracks from being generated in a silicon nitride layer or a silicon oxide nitride layer on a silicon oxide layer that includes at least one of boron and phosphor.

It may be considered that the cracks are generated in the silicon nitride layer formed on the BPSG layer because the BPSG layer melts or softens due to a thermal process that is carried out after formation of the silicon nitride layer, and stress is generated at an interface of the silicon nitride layer and the BPSG layer when the melted or softened BPSG layer thereafter hardens. It may also be regarded that the cracks are more easily generated at the corner portions of the through hole since the stress is concentrated at the corner portions.

According to the studies made by the present inventors, it was found that the frequency at which the cracks are generated in the silicon nitride layer is greatly dependent on the thickness of the silicon nitride layer. In addition, since the cracks are more easily generated at the corner portions of the through hole, it was regarded that the generation of the cracks may be suppressed if the corner portions of the through hole are smoothened or rounded.

A description will hereunder be given of a method of forming the silicon nitride layer to a thickness that is suited for the purpose of preventing the generation of the cracks in the silicon nitride layer, and a method of smoothing the corner portions of the through hole.

First, a description will be given of a tenth embodiment of the method of producing the semiconductor device according to the present invention, by referring to FIGS. 21 through 23. In this embodiment of the method, the silicon nitride layer is formed to a thickness within a range that is suited for preventing the generation of the cracks in the silicon nitride layer.

FIGS. 21A through 21E are cross sectional views showing a DRAM at important production processes of this embodiment. FIG. 22 is a partial plan view showing the DRAM, and a region surrounded by a two-dot chain line corresponds to 1 memory cell. FIG. 23 is a diagram showing a crack generation frequency at a through hole portion of a dicing region with respect to the thickness of a silicon nitride layer on a BPSG layer.

Figure 22:
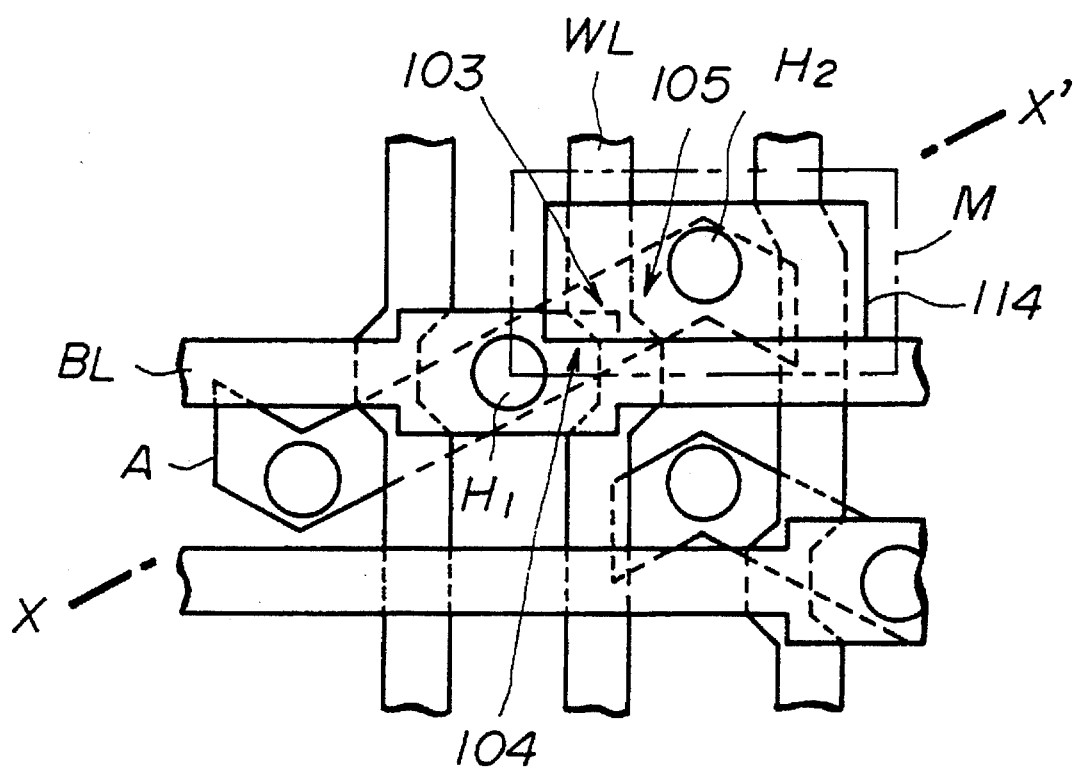
FIG. 22 is a plan view showing a memory cell of a DRAM produced by the tenth embodiment of the method.

As shown in FIG. 22, an active region A is defined on a silicon substrate surface. A MOSFET is made up of a gate electrode 103, a source region 104 and a drain region 105 is formed in the active region A. The gate electrode 103 extends in the up and down (vertical) direction in FIG. 22, and forms a word line WL. A bit line BL extends in the right and left (horizontal) direction in FIG. 22. The source region 104 is connected to the bit line BL via a contact hole $H_1$. The drain region 105 is connected to a fin type storage electrode 114 via a contact hole $H_2$.

FIGS. 21A through 21E respectively show cross sections taken along a line X–X' in FIG. 22 at important production processes of this embodiment.

Figure 21A:
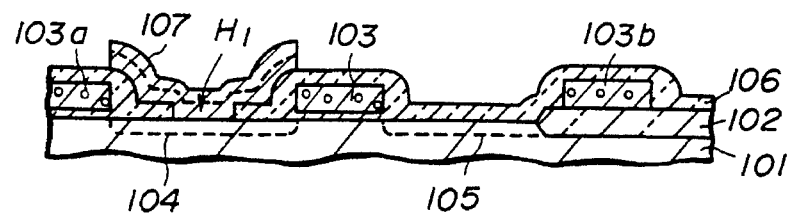
FIGS. 21A, 21B, 21C, 21D and 21E respectively are cross sectional views for explaining a tenth embodiment of the method of producing the semiconductor device according to the present invention.

As shown in FIG. 21A, the surface of a p-type silicon substrate 101 is selectively oxidized to form a field oxide layer 102 having a thickness of 200 nm, so as to define an active region. A gate oxide layer having a thickness of 10 nm is formed on the surface of this active region by thermal oxidation, and a polysilicon layer having a thickness of 150 nm is formed on this gate oxide layer by CVD. The polysilicon layer is patterned to form gate electrodes 103 and 103a. The gate electrode 103a belongs to a MOSFET of a memory cell that is adjacent to one side the memory cell which includes the gate electrode 3. The gate electrode is also used in common as the word line, and a word line 103b for a memory cell that is adjacent to the other side of the memory cell which includes the gate electrode 103 is simultaneously formed on the field oxide layer 102 as the gate electrodes 103 and 103a.

The n-type source region 104 and the drain region 105 are formed in self-alignment to the gate electrode 103 by ion implantation or by injecting ions.

An interlayer insulator layer 106 made of $SiO_2$ and having a thickness of 100 nm is formed by CVD, and the contact hole $H_1$ is provided above the source region 104. A polysilicon layer having a thickness of 50 nm and a tungsten silicide (WSi) layer having a thickness of 100 nm are successively formed by CVD on the entire surface including the contact hole $H_1$. The WSi layer and the polysilicon layer are patterned to form a bit line 107 which connects to the source region 104.

Figure 21B:
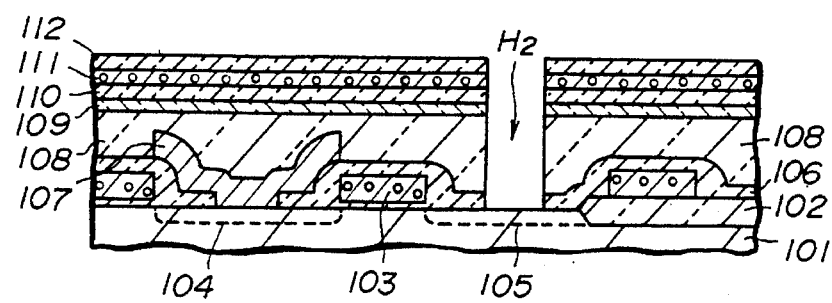

As shown in FIG. 21B, a BPSG layer 108 having a thickness of 150 nm is formed on the entire substrate surface by CVD so as to cover the bit line 107, and a reflow process is then carried out. For example, the BPSG layer 108 is formed by using as material gases TEOS (tetraethyl oxysilane) having a flow rate of 10 to 20 sccm, TMOP ($PO(OCH_3)_4$) having a flow rate of 1 to 5 sccm, TEB ($B(OC_2H_5)_4$) having a flow rate of 1 to 5 sccm, and ozone having a flow rate of 500 to 2000 sccm, at a substrate temperature of 400° C., for example. In addition, the reflow process is carried out for 15 minutes at 850° C., for example, under a nitrogen atmosphere.

Next, dichlorosilane ($SiH_2Cl_2$) having a flow rate of 50 to 100 sccm and ammonia ($NH_3$) having a flow rate of 100 to 500 sccm are used as material gases, and a silicon nitride layer 109 is formed by CVD under a substrate temperature of 750° to 800° C. and a pressure of 0.2 to 0.5 Torr. Three kinds of silicon nitride layers 109 are prepared, respectively having thicknesses of 20 nm, 40 nm and 80 nm.

Thereafter, a silicon oxide layer 110 having a thickness of 50 nm, an amorphous silicon layer 111 having a thickness of 50 nm, and a silicon oxide layer 112 having a thickness of 50 nm are successively stacked in this order. Each silicon oxide layer is formed by CVD using a gas mixture of $SiH_4$ and $N_2O$ as the material gas at a substrate temperature of 750° to 850° C. and a pressure of 0.5 to 2 Torr. The amorphous silicon layer is formed by CVD using a gas mixture of $SiH_4$ and $PH_3$ as the material gas at a substrate temperature of 500° to 550° C. and a pressure of 0.2 to 1 Torr. The amorphous silicon layer 111 is doped with phosphor (P) and is given a conductive characteristic.

The contact hole $H_2$ which penetrates from the silicon oxide layer 112 to the interlayer insulator layer 106 and reaches the surface of the drain region 105 is formed. A through hole which extends from the silicon oxide layer 112 and reaches the surface of the silicon substrate 101 is also formed in the dicing region of the wafer. The through hole in the dicing region is used as a target mark for making the necessary alignment at the time of the photolithography process, and has a rectangular shape with a side of several tens of μm.

The contact hole $H_2$, the through hole and the like may be formed by a known process including the steps of forming a resist layer on the entire substrate surface and patterning the resist layer. More particularly, the resist layer is patterned by exposing the resist layer using a reticle having holes or openings corresponding to the contact hole $H_2$, the through hole and the like, and developing the exposed pattern on the resist layer to form holes or openings corresponding to the contact hole $H_2$, the through hole and the like in the resist layer. The reticle will be described later.

Figure 21C:
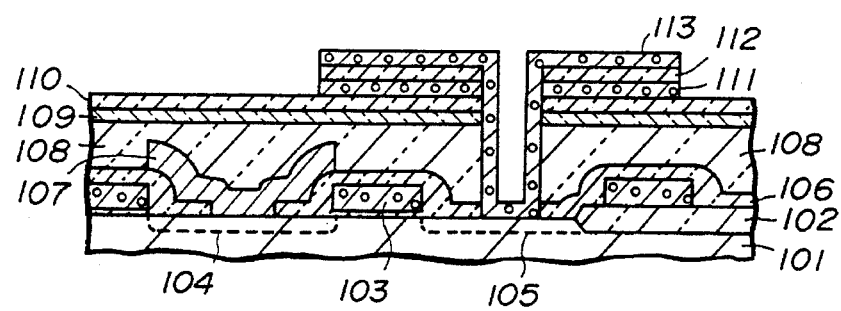

As shown in FIG. 21C, an amorphous silicon layer 113 having a thickness of 50 nm is formed by CVD on the entire substrate surface including the inner surface of the contact hole $H_2$. The amorphous silicon layer 113, the silicon oxide layer 112 and the amorphous silicon layer 111 are successively etched so that they remain at the peripheral portion of the contact hole $H_2$, and are patterned to have the shape of the fin type storage electrode 114 in the plan view of FIG. 22.

Figure 21D:
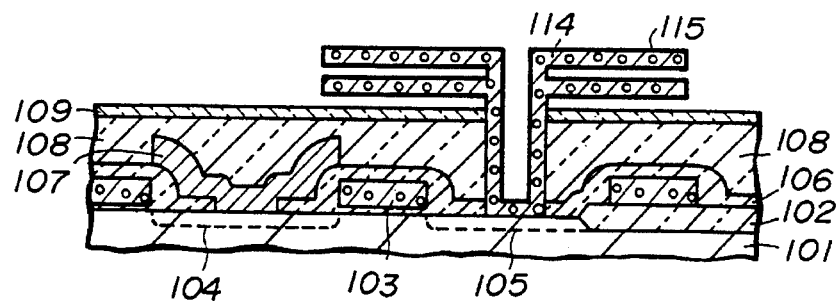

As shown in FIG. 21D, the etching of the silicon oxide layers 110 and 112 is carried out using a HF solution. As a result, the silicon oxide layers under the amorphous silicon layers 111 and 113 are removed, thereby forming a fin type storage electrode 114 that is made of amorphous silicon. In this state, the silicon nitride layer 109 functions as an etching stopper.

Next, a dielectric layer 115 made up of a silicon nitride layer having a thickness of 5 nm and a silicon oxide layer having a thickness of 1 nm is formed on the exposed surface of the fin type storage electrode 114. The silicon nitride layer is formed by CVD using a gas mixture of $SiH_2Cl_2$ and $NH_3$ as the material gas at a substrate temperature of 600° to 750° C. Thereafter, a thermal process is carried out at 800° C. under an oxygen atmosphere, so as to form the silicon oxide layer or a silicon oxide nitride layer on the surface of the silicon nitride layer. Cracks are easily generated in the silicon nitride layer 109 when this thermal process is carried out.

Figure 21E:
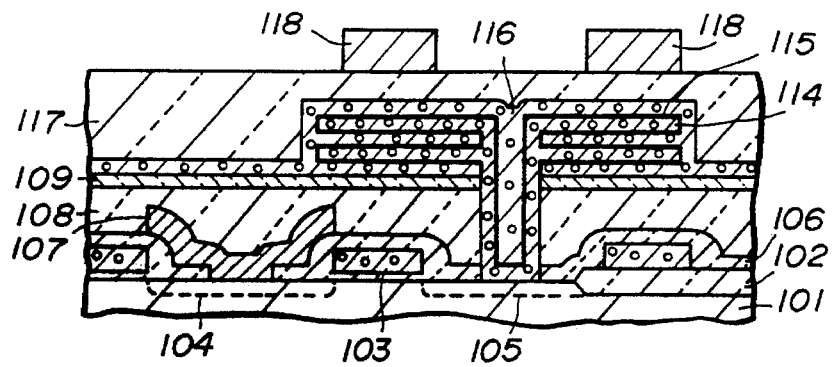

As shown in FIG. 21E, an amorphous silicon layer 116 having a thickness of 100 nm is formed by CVD on the entire substrate surface including the exposed surface of the dielectric layer 115. The amorphous silicon layer 116 is formed under conditions similar to those used when forming the amorphous silicon layers 111 and 113.

An interlayer insulator layer 117 is formed on the amorphous silicon layer 116, and a predetermined metal wiring 118 is formed on the interlayer insulator layer 117.

The generation of the cracks in the DRAMs which are formed as described above and having the silicon nitride layer 109 with the different thicknesses were checked by a metal microscope.

Figure 23:
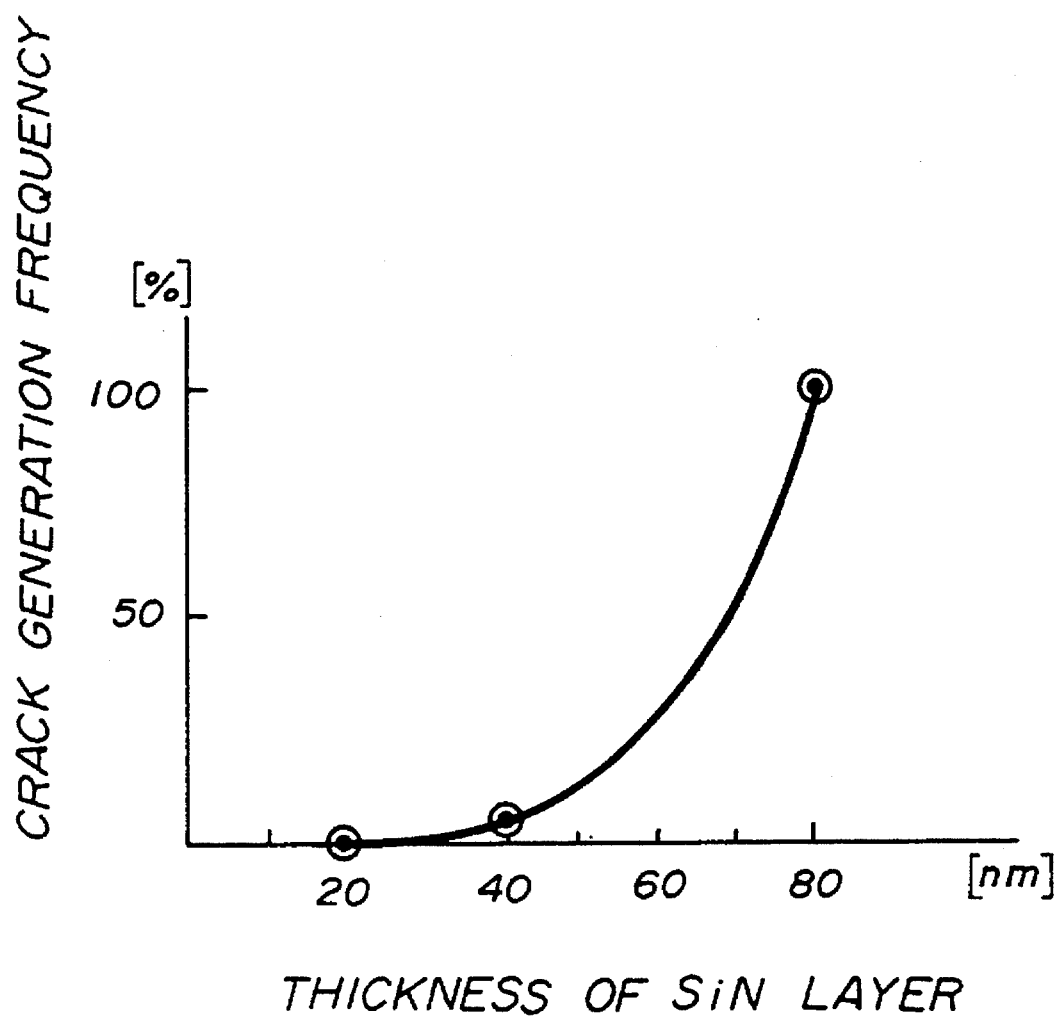
FIG. 23 is a graph showing a crack generation frequency versus thickness of a SiN layer.

FIG. 23 shows the crack generation frequency at the through hole portion of the dicing region with respect to the thickness of the silicon nitride layer 109 on the BPSG layer 108. In FIG. 23, the abscissa indicates the thickness of the silicon nitride layer 109 in nm, and the ordinate indicates the crack generation frequency in %.

The cracks are not generated when the silicon nitride layer 109 has the thickness of 20 nm. The crack generation frequency is approximately 5% when the silicon nitride layer 109 has the thickness of 40 nm. In addition, the crack generation frequency is approximately 100% when the silicon nitride layer 109 has the thickness of 80 nm. Therefore, it may be regarded that the cracks will not be generated if the thickness of the silicon nitride layer 109 is 30 nm or less.

The silicon nitride layer 109 functions as the etching stopper when the silicon oxide layers 110 and 112 shown in FIG. 21C are etched. For this reason, the silicon nitride layer 109 must have a thickness that is sufficient to withstand the etchant until the silicon oxide layers 110 and 112 under the fin type storage electrode 114 are removed in their entirety.

If the shape of the fin type storage electrode 114 in the plan view is a rectangular shape having a short side with a length a and the etchant has an etching rate $E_{SIO}$ with respect to the silicon oxide layers 110 and 112, an etching time $T_{etch}$ that is required can be described by the following formula (2).

$$T_{etch} = (a/2)/E_{SIO} \quad (2)$$

On the other hand, if the etchant has an etching rate $E_{SIN}$ with respect to the silicon nitride layer 109, a thickness $t_{se}$ of the silicon nitride layer 109 that is etching during the etching time $T_{etch}$ can be described by the following formula (3).

$$t_{se} = E_{SIN} \cdot T_{etch} \quad (3)$$

Therefore, it is possible to derive the following formula (4) from the above formulas (2) and (3).

$$t_{se} = (a/2) \cdot (E_{SIN}/E_{SIO}) \quad (4)$$

Accordingly, it is desirable that the thickness of the silicon nitride layer 109 is set to $(a/2) \cdot (E_{SIN}/E_{SIO})$ or greater.

In the case of the diluted HF solution used in this embodiment, $E_{SIO}$=60 nm/min and $E_{SIN}$=1.5 nm/min. If a=0.7 μm, for example, the thickness of the silicon nitride layer 109 should thus be set to 8.75 nm or greater.

In this embodiment, it is assumed for the sake of convenience that the shape of the fin type storage electrode 114 in the plan view is a rectangular shape. However, the shape of the fin type storage electrode 114 in the plan view is not limited to the rectangular shape. For example, if the fin type storage electrode 114 has a parallelogram shape in the plan view, the length a simply needs to be replaced by a length of a perpendicular drawn from the center of the parallelogram to the long side of the parallelogram.

Next, a description will be given of an eleventh embodiment of the method of producing the semiconductor device according to the present invention, by referring to FIGS. 24 through 27. In this embodiment of the method, the corner portions of the through hole are smoothened.

Figure 24A:
FIGS. 24A and 24B respectively are plan views showing a reticle pattern for forming a contact hole having a size of approximately 1 μm and a pattern exposed on a wafer.
Figure 24B:

The size of the contact hole $H_2$ that is formed in the process described above in conjunction with FIG. 21B is approximately 1 μm or less. When the contact hole $H_2$ has such a small size, even if the pattern on the reticle is a square as shown in FIG. 24A, the pattern that is actually exposed on the wafer becomes rounded and becomes an approximate circle as shown in FIG. 24B. Accordingly, the corner portions of the contact hole $H_2$ are rounded and smoothened, thereby reducing the possibility of the cracks being generated.

In the process described above with reference to FIG. 21B, rectangular through holes having a side of approximately several tens of μm are formed in the dicing region of the wafer and within the chip, simultaneously as the formation of the contact hole $H_2$. These through holes are formed as the target mark and a test pattern. The test pattern is used to check whether or not the contact hole is completely etched, to make a check after the process ends or the like.

Figure 25A:
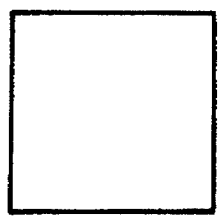
FIGS. 25A and 25B respectively are plan views showing a reticle pattern for forming a through hole having a size of approximately several tens of μm and a pattern exposed on the wafer.
Figure 25B:
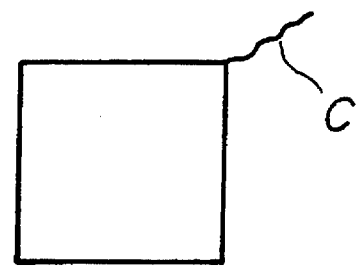

However, when the size of the through hole that is formed is several tens of μm, the pattern on the reticle has a rectangular shape shown in FIG. 25A and the pattern that is actually exposed on the wafer also has a rectangular shape as shown in FIG. 25B. In other words, corner portions are also formed in the rectangular through hole that is actually exposed on the wafer. Such a corner portion causes the generation of the crack, and a crack C may be generated at the corner portion as shown in FIG. 25B.

FIG. 26A shows a pattern on the reticle that smoothens the corner portions of the pattern exposed on the wafer as shown in FIG. 26B. In FIG. 26A, a triangular cutout is provided at each corner portion of the rectangular through hole on the reticle. As a result, the corner portions of the through hole exposed on the wafer are rounded or smoothened.

Of course, the corner portion of the rectangular through hole on the reticle may have other shapes. For example, the corner portion may have a polygonal line shape that swells out as shown in FIG. 27. In addition, the through hole need not necessarily have a rectangular shape. The through hole may have a polygonal shape only having obtuse angled corner portions, a generally polygonal shape with rounded or smoothened corner portions or, a circular shape. In the case of the polygonal shape, it is desirable that the polygonal shape has n corners with obtuse angles, where $n \geq 5$.

Next, a description will be given of a reticle pattern provided with the cutout portion at the corners as in the case shown in FIG. 26A, and of a pattern actually exposed on the wafer, by referring to FIGS. 28 and 29.

Figure 28A:
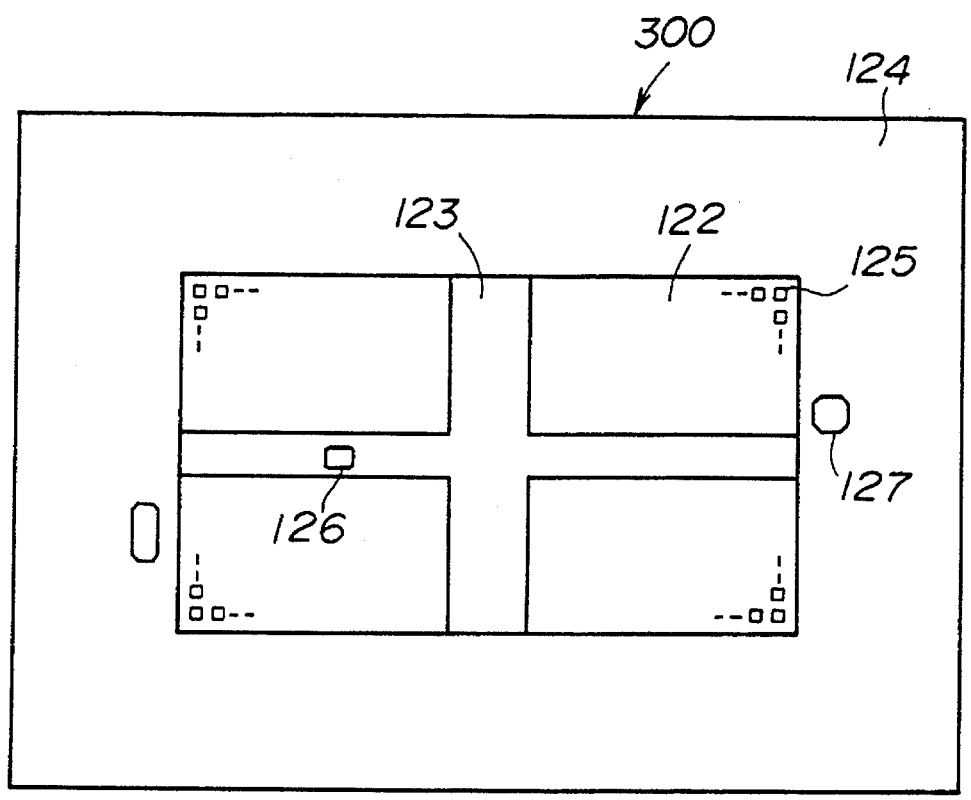
FIG. 28A is a plan view showing a reticle pattern used in the eleventh embodiment of the method.

FIG. 28A is a plan view showing a reticle pattern for making a ⅕ reduction exposure. This reticle pattern on a reticle substrate 300 includes 4 memory cell regions 122 in which the memory cells are formed, a peripheral circuit region 123 provided between the memory cell regions 122, and a peripheral region 124 surrounding the memory cell regions 122 and the peripheral circuit region 123.

Each memory cell region 122 includes patterns 125 for forming the contact hole $H_2$ shown in FIG. 22, for example. A test pattern 126 is formed in the peripheral circuit region 123, and a target mark 127 is formed in the peripheral region 124.

Figures 28B, 28C:
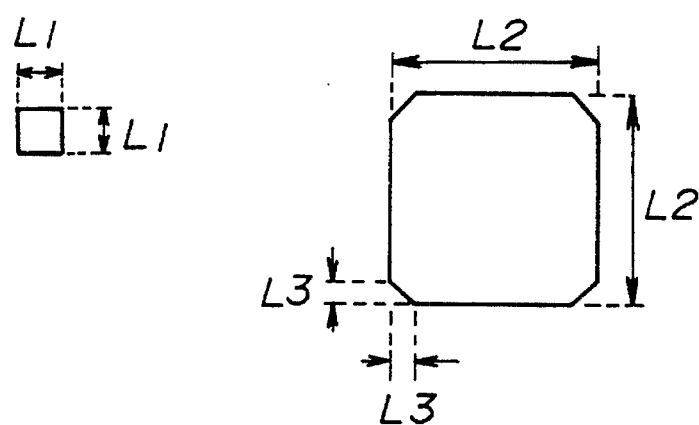
FIG. 28B is a plan view showing a pattern of the reticle shown in FIG. 28A for forming a contact hole.
FIG. 28C is a plan view showing a pattern of the reticle shown in FIG. 28A for forming a test pattern or a target mark.

FIG. 28B is a plan view showing the shape of the pattern 125 for forming the contact hole $H_2$, for example. In this embodiment, the pattern 125 has a square shape with a side L1 of 2.5 μm.

FIG. 28C is a plan view showing the shape of the check pattern 126 and the target mark 127. In this embodiment, the test pattern 126 and the target mark 127 have an octagonal shape. This octagonal shape is obtained by smoothing each corner portion of a square shape with a side L2 of 180 μm. More particularly, the corner portion of the square shape is cut out in a shape of a right angle isosceles triangle having 2 sides forming the right angle and respectively having a length L3 of 10 μm.

Figure 29A:
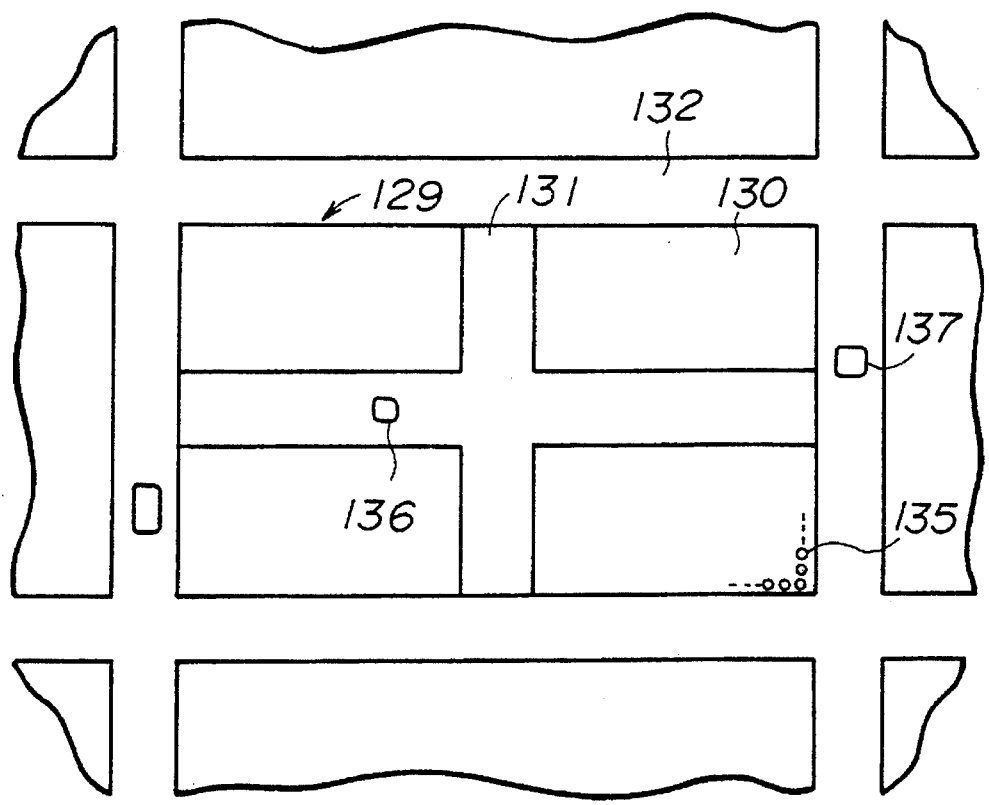
FIG. 29A is a plan view showing a pattern exposed on the wafer using the reticle pattern shown in FIG. 28A.

FIG. 29A is a plan view showing a pattern that is actually exposed on the wafer using the reticle pattern shown in FIG. 28A. In FIG. 29A, chip regions 129 are periodically arranged in the up and down (vertical) direction and in the right and left (horizontal) direction, and dicing regions 132 are provided between the chip regions 129. Each chip region 129 is made up of a memory cell region 130 and a peripheral circuit region 131 respectively corresponding to the memory cell region 122 and the peripheral circuit region 123 of the reticle pattern shown in FIG. 28A.

Contact holes 135 corresponding to the patterns 125 and for forming contact holes are formed within the memory cell region 130. A through hole 136 for testing and corresponding to the test pattern 126 is formed within the peripheral circuit region 131. A through hole 137 for target mark and corresponding to the target mark 127 is formed in the dicing region 132.

Figure 29B:
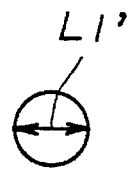
FIG. 29B is a plan view showing a contact hole exposed on the wafer.

FIG. 29B is a plan view showing the shape of the contact hole 135. The reticle pattern has a square shape with a side L1 of 2.5 μm, but the corresponding contact hole 135 on the wafer has a circular shape with a diameter L1' of approximately 0.5 μm.

Figure 29C:
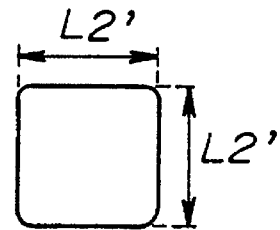
FIG. 29C is a plan view showing a through hole for testing or for target mark exposed on the wafer.

FIG. 29C is a plan view showing the shape of the through hole 136 for testing and the through hole 137 for target mark, which have the same size and shape in this embodiment. In FIG. 29C, the through hole has a square shape with a side L2' of 36 μm, and each corner portion of the square shape is rounded or smoothened as shown.

The present inventors conducted experiments by making the silicon nitride layer 109 shown in FIG. 21B have a thickness of 80 nm, forming the contact and through holes using the reticle pattern shown in FIG. 28A, and carrying out the processes described above in conjunction with FIGS. 21B through 21E. As a result of such experiments, it was confirmed that no cracks are generated.

On the other hand, when no cutout was provided at each corner portion of the test pattern 126 and the target mark 127 shown in FIG. 28A, and each side of the square shape forming the test pattern 126 and the target mark 127 was set to 180 μm, it was confirmed through experiments that the cracks are generated at a rate of approximately 100%.

Therefore, when the corner portions of the through holes are smoothened or rounded, it is possible to prevent the generation of the cracks even when the thickness of the silicon nitride layer 109 is relatively large.

In the tenth and eleventh embodiments, the contact hole on the wafer desirably has an approximate circular shape in the plan view, and this approximate circular shape is contained within an imaginary square having a side of 1 μm or less. On the other hand, the through hole on the wafer desirably has a shape that contains an imaginary circle having a diameter of 1 μm or greater in the plan view, and has inner peripheral edges with smoothened or rounded corner portions. Furthermore, the pattern on the reticle for forming the contact hole desirably has a square shape in the plan view, and this square shape has a side of 5.0 μm or less. On the other hand, the pattern on the reticle for forming the test pattern or the target mark desirably has a shape that is contained within an imaginary circle having a diameter of 5.0 μm or greater in the plan view, and has inner peripheral edges with smoothened or rounded corner portions. For example, this shape of the pattern on the reticle for forming the test pattern or the target mark has n corner portions with obtuse angles, where $n \geq 5$.

The present inventors produced 64-Mbit DRAMs having a memory cell size of 2 μm² and a chip size of 240 mm² using the tenth and eleventh embodiments of the method described above, and it was confirmed that the generation of the cracks can be prevented.

In the tenth and eleventh embodiments of the method, the generation of the cracks is prevented by controlling the thickness of the silicon nitride layer or controlling the shape of the through hole in the plan view. However, the present inventors through experiments also found that the generation of the cracks can be suppressed by making the horizontal length of the fin that is formed at the through holes for testing and for target mark greater than the horizontal length of the fin of the fin type electrode of the memory cell.

Figure 30:
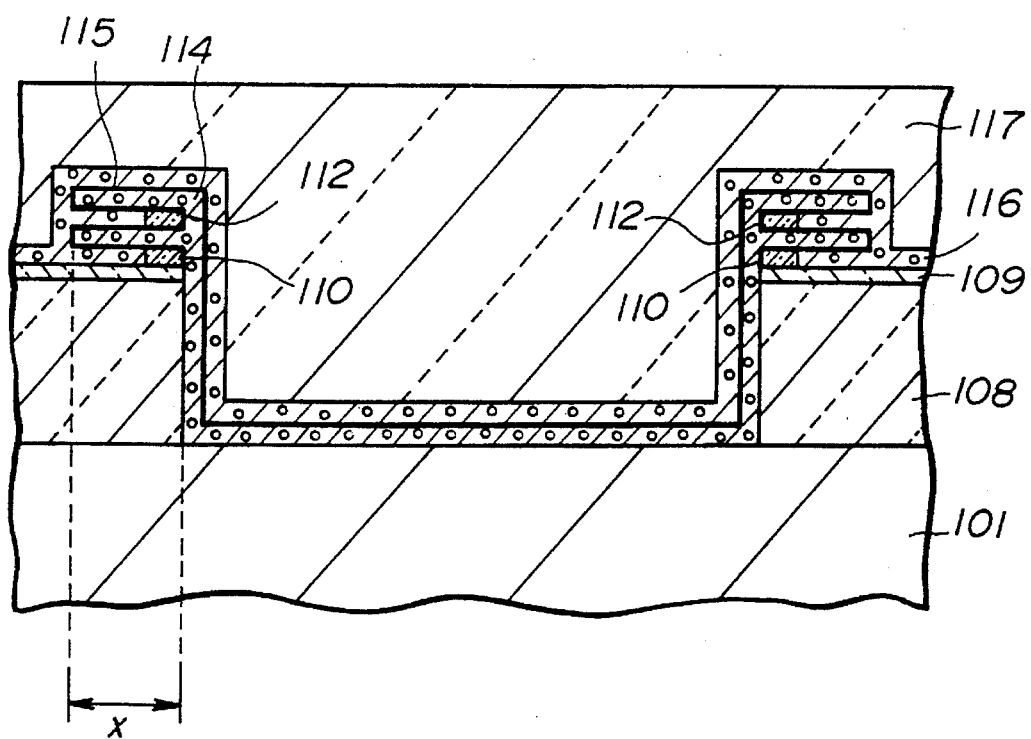
FIG. 30 is a cross sectional view showing a substrate in a vicinity of a through hole for testing.

FIG. 30 is a cross sectional view showing the substrate in the vicinity of the through hole for testing. In FIG. 30, those parts which are the same as those corresponding parts in FIGS. 21A through 21E are designated by the same reference numerals, and a description thereof will be omitted.

In FIG. 30, the fin type electrode 114, the dielectric layer 115 and the opposing electrode 116 are formed in the periphery of the through hole for testing, by processes similar to those described above in conjunction with FIGS. 21B through 21E. In this case, the area of the through hole for testing at the opening is larger than that of the contact hole $H_2$ shown in FIG. 21B.

A horizontal length x of the fin of the fin type electrode 114 is made greater than the horizontal length of the fin type electrode of the memory cell. Accordingly, even when the silicon oxide layers 110 and 112 are etched in their entirety at the fin type electrode part of the memory cell during the process described above in conjunction with FIG. 21C, the silicon oxide layers 110 and 112 remain at the inner parts of the gap of the fin type electrode at the through hole for testing.

The present inventors confirmed through experiments that the generation of the cracks can be suppressed by making the horizontal length x of the fin longer. Hence, as long as the space permits, it is desirable to make the horizontal length x of the fin at the through hole for testing as long as possible. Similarly, it is also desirable to make the horizontal length of the fin at the through hole for target mark in the dicing region as long as possible.

The cracks in the silicon nitride layer 109 are easily generated by the thermal process that is carried out to form the dielectric layer 115 shown in FIG. 21D. It may be regarded that the generation of the cracks is suppressed by making the horizontal length x of the fin longer, because a silicon oxide layer is formed on the surface at the end portions of the silicon nitride layer 109 during this thermal process.

In the tenth and eleventh embodiments of the method described above, the silicon nitride layer is formed on the surface of the BPSG layer and the storage electrode of the fin type capacitor is formed on the silicon nitride layer. However, the application of the method of the present invention is not limited to the fin type capacitor. In other words, the tenth embodiment of the method is effective when applied to the production of a semiconductor device including the steps of forming a silicon nitride layer on the surface of a BPSG layer and thereafter carrying out a thermal process at a temperature greater than or equal to a temperature at which the BPSG layer softens or melts. On the other hand, the eleventh embodiment of the method is effective when applied to the production of a semiconductor device including the step of forming a through hole that penetrates a silicon nitride layer and a BPSG layer.

In the tenth and eleventh embodiments of the method described above, the BPSG layer is used to planarize the surface, and the silicon nitride layer is formed on this BPSG layer. However, it is possible to use materials other than BPSG, such as BSG (boron silicate glass) and PSG (phosphor silicate glass) which have low melting points. In addition, it is possible to use a silicon oxide nitride layer in place of the silicon nitride layer, because stress is similarly generated at the interface of the silicon oxide nitride layer and the BPSG layer or the like.

Further, the present invention is not limited to these embodiments, but various variations and modifications may be made without departing from the scope of the present invention.

What is claimed is:

1. A method of producing a semiconductor device comprising the steps of:

(a) preparing a substrate having a semiconductor element formed in a region of a surface of the substrate;

(b) forming a first layer on the substrate, said first layer being made of silicon oxide including at least one of boron and phosphorus;

(c) forming a second layer on a surface of the first layer, said second layer being made of a material selected from the group consisting of silicon nitride and silicon oxide nitride;

(d) coating a resist layer on the entire surface of the substrate;

(e) disposing on said resist a reticle, having a first opening, having a polygonal shape having n corners, respectively having obtuse angles, where n is a natural number satisfying $n \geq 5$, through which a portion of said resist is exposed;

(e-1) developing said portion of said resist layer exposed through said first opening so as to form a second opening in the resist layer whereby exposing a portion of said second layer; and (f) etching the second and first layers via the second opening.

2. The method of producing the semiconductor device as claimed in claim 1, which further comprises, after said step (c) and prior to said step (d), the step of:

(g) forming a third layer on the second layer, said third layer having an etching resistance different from that of the second layer, and also etching the third layer via the second opening during said step (f).

3. The method of producing the semiconductor device as claimed in claim 2, wherein:

said step (a) prepares a substrate having a test pattern region formed in a portion of the substrate, and said step (e-1) forms the second opening in the test pattern region on the surface of the substrate.

4. The method of producing the semiconductor device as claimed in claim 3, wherein:

said step (e-1) forms at least a third opening simultaneously as the forming of second opening, said step (f) etches the third, second and first layers via the third opening to form a contact hole, and further comprising the steps of:

(h) after said step (f), forming a first conductor layer on an entire surface of the semiconductor device including an inner surface of the contact hole, said first conductor layer having an etching resistance different from that of the third layer;

(i) patterning the first conductor layer so that the first conductor layer remains on the inner surface of the contact hole and in a region in a vicinity of an opening of the contact hole; and (j) etching the third layer to expose a bottom surface of the first conductor layer.

5. The method of producing the semiconductor device as claimed in claim 4, which further comprises, after said step (g) and prior to said step (d), the steps of:

(k) alternately stacking a second conductor layer and a fourth layer on the third layer to form a stacked structure having at least two layers, said second conductor layer having an etching resistance different from that of the third layer, said fourth layer having an etching resistance that is approximately the same as that of the third layer, said step (f) forming the contact hole that penetrates the stacked structure; and (1) after said step (i), patterning the stacked structure to a shape that is approximately the same as that of the first conductor layer, said step (j) etching the fourth layer simultaneously as the third layer and exposing bottom surfaces of the first and second conductor layers.

6. The method of producing the semiconductor device as claimed in claim 5, wherein said third and fourth layers are respectively made of silicon oxide.

7. The method of producing the semiconductor device as claimed in claim 4, which further comprises, after said step (j), the steps of:

(k) forming a dielectric layer on exposed surfaces of the first and second conductor layers; and (1) forming a third conductor layer on the entire surface of the semiconductor device including a surface of the dielectric layer.

8. The method of producing the semiconductor device as claimed in claim 7, wherein:

said semiconductor element is made up of a MOSFET having an insulated gate electrode and source and drain regions formed on both sides of the insulated gate electrode, and said step (f) forms the contact hole so as to expose a surface of one of the source and drain regions.

9. The method of producing the semiconductor device as claimed in claim 4, wherein said step (e) uses a reticle having a fourth opening having a rectangular shape for forming the third opening.

10. The method of producing the semiconductor device as claimed in claim 2, which further comprises, after said step (f), the step of:

(h) etching the third layer under conditions which will not completely remove said second layer,
wherein, prior to said step (h), said second layer has a thickness greater than the amount of the thickness of the second layer etched in said step (h) but less than 30 nm.

11. The method of producing the semiconductor device as claimed in claim 4, wherein:

said step (i) patterns the first conductor layer to a parallelogram shape having the opening of the contact hole at approximately a center of the parallelogram, said step (j) etches the third layer by an amount corresponding to a length of a perpendicular drawn from the center of the parallelogram to a longer side of the parallelogram, and said step (c) forms the second layer to a thickness greater than the amount of the thickness of the second layer removed by said etching in said step (j) but less than 30 nm.

* * * * *